United States Patent
Ochi et al.

(10) Patent No.: US 8,599,937 B2
(45) Date of Patent: Dec. 3, 2013

(54) PULSE TRANSFORMER DRIVER

(71) Applicant: Microsemi Corporation, Aliso Viejo, CA (US)

(72) Inventors: Sam Seiichiro Ochi, Saratoga, CA (US); Charles Coleman, Fort Collins, CO (US)

(73) Assignee: Microsemi Corporation, Aliso Viejo, CA (US)

( * ) Notice: Subject to any disclaimer, the term of this patent is extended or adjusted under 35 U.S.C. 154(b) by 0 days.

(21) Appl. No.: 13/718,131

(22) Filed: Dec. 18, 2012

(65) Prior Publication Data

US 2013/0135024 A1    May 30, 2013

Related U.S. Application Data

(63) Continuation of application No. 12/416,363, filed on Apr. 1, 2009, now Pat. No. 8,345,779.

(60) Provisional application No. 61/041,459, filed on Apr. 1, 2008, provisional application No. 61/041,508, filed on Apr. 1, 2008.

(51) Int. Cl.
*H04B 3/00* (2006.01)

(52) U.S. Cl.
USPC ........... 375/258; 375/257; 375/219; 375/295; 327/304

(58) Field of Classification Search
USPC .................... 375/258, 257, 219, 295; 327/304
See application file for complete search history.

(56) References Cited

U.S. PATENT DOCUMENTS

| | | | |
|---|---|---|---|
| 2,677,760 A | 5/1954 | Bess | |
| 4,271,526 A | 6/1981 | Flora | |
| 4,489,417 A | 12/1984 | Askin et al. | |
| 4,631,428 A | 12/1986 | Grimes | |
| 4,694,384 A | 9/1987 | Steigerwald et al. | |
| 4,995,054 A | 2/1991 | Eckersley | |
| 5,434,694 A | 7/1995 | Saito et al. | |
| 5,793,816 A | 8/1998 | Hui | |
| 5,796,781 A * | 8/1998 | DeAndrea et al. | 375/288 |
| 6,404,251 B1 * | 6/2002 | Dwelley et al. | 327/172 |
| 6,741,646 B1 | 5/2004 | Mohan et al. | |

(Continued)

FOREIGN PATENT DOCUMENTS

| | | |
|---|---|---|
| DE | 3836805 A1 | 5/1989 |
| EP | 0450418 A2 | 10/1991 |
| ES | 2063701 A2 | 1/1995 |
| JP | 63298125 A | 12/1988 |

OTHER PUBLICATIONS

Translation of Office Action; German Patent Application No. 11 2009000795.3 dated Jan. 12, 2012; Microsemi Corp.

*Primary Examiner* — Kenneth Lam
(74) *Attorney, Agent, or Firm* — Simon Kahn

(57) ABSTRACT

Methods, systems, and devices are described for providing a communication system for handling pulse information. Embodiments of the invention provide a pulse shaping unit operable to avoid saturation of the pulse transformer, while being easily incorporated into IC processes. Some embodiments of the pulse shaping unit provide a two-to-three level driver unit for converting a two-level input voltage signal to a three-level driver signal for driving a pulse transformer. Other embodiments of the pulse shaping unit provide components configured to differentially drive a pulse transformer, effectively converting a two-level input voltage signal to a three-level driver signal.

16 Claims, 19 Drawing Sheets

(56) References Cited

U.S. PATENT DOCUMENTS

| | | |
|---|---|---|
| 7,124,221 B1 | 10/2006 | Zerbe et al. |
| 7,158,573 B2 | 1/2007 | Hershbarger |
| 7,196,919 B2 * | 3/2007 | Fu et al. .......................... 363/98 |
| 7,671,372 B2 * | 3/2010 | Morikawa ....................... 257/81 |
| 2002/0154519 A1 | 10/2002 | Nakahara et al. |
| 2004/0239487 A1 * | 12/2004 | Hershbarger ............ 340/310.07 |
| 2005/0093731 A1 | 5/2005 | Skov et al. |
| 2005/0271149 A1 * | 12/2005 | Dupuis ......................... 375/258 |

* cited by examiner

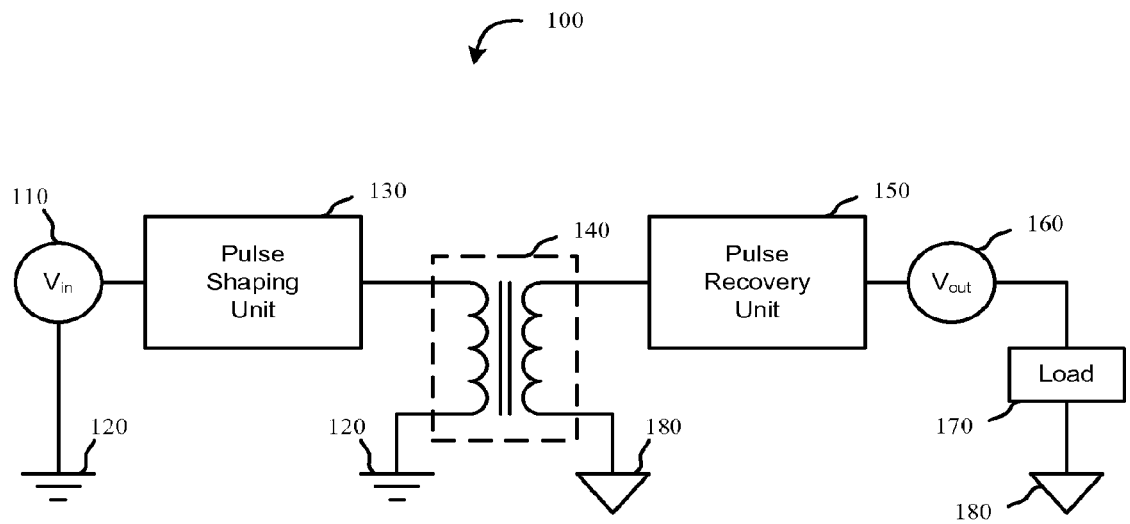
FIG. 1A
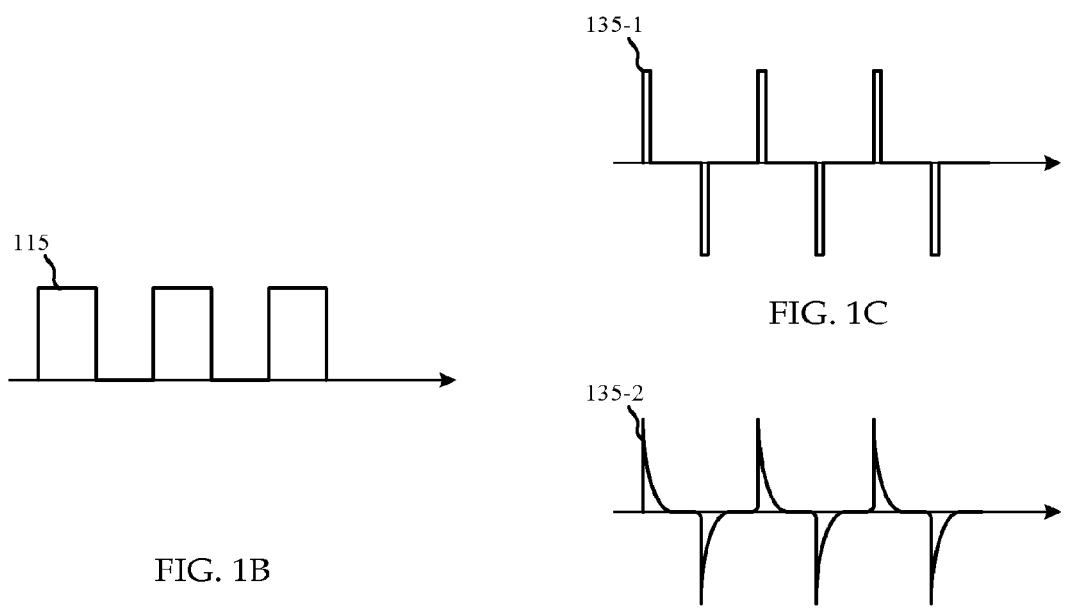
FIG. 1B
FIG. 1C
FIG. 1D

PULSE TRANSFORMER DRIVER

CROSS-REFERENCES

This application is a continuation of pending application Ser. No. 12/416,363, filed Apr. 1, 2009, entitled "PULSE TRANSFORMER DRIVER", which claims priority from U.S. Provisional Patent Application No. 61/041,459, filed Apr. 1, 2008, entitled "PULSE TRANSFORMER DRIVER", and from U.S. Provisional Patent application No. 61/041,508, filed Apr. 1, 2008, entitled "BIDIRECTIONAL COMMUNICATIONS PULSE TRANSFORMER DRIVER", which are hereby incorporated by reference, as if set forth in full in this document, for all purposes.

BACKGROUND

The present invention relates to communication systems in general and, in particular, to transmission medium drivers.

Many electronic systems include subsystems operable to send, receive, and otherwise handle communication signals. These communication signals may apply to large numbers of applications and functions. Some communication signals apply externally, for example, as information being sent to or received from other systems. Other communication signals apply internally to the system, for example, to control or to send information to other components of the system.

Some electronic systems use transmission mediums, like pulse transformers, to handle some or all of these communication signals. Using a pulse transformer may yield certain desired functionality, like the ability to adjust signal amplitude, to match impedance between a source and a load, to provide an isolation boundary between two portions of a circuit, etc. For example, a pulse transformer may be used to send a control signal from power circuitry that is connected to earth ground, across an isolation boundary, and to control circuitry that is connected to floating (e.g., chassis) ground.

SUMMARY

Among other things, methods, systems, and devices are described for providing a transmission medium driver operable to avoid saturation, while being easily incorporated into IC processes. Embodiments provide pulse shaping units configured to be implemented within typical integrated circuit ("IC") processes. For example, embodiments convert a two-level input signal to a three-level driver signal for driving on end of a transmission medium. The three level driver signal (or a functionally related signal) is received at the other end of the transmission medium and converted back to a two-level output signal for driving a load. Embodiments are configured to run asynchronously (e.g., as a function of received pulse widths, rather than a clock frequency) to provide compatibility with pulse-width modulated ("PWM") input signals. For example, certain embodiments of the driver signals include very narrow pulses to provide further compatibility with a broad range of PWM frequencies. In some embodiments, a two-to-three level ("TTTL") driver unit is provided as a pulse shaping unit for driving the transmission medium. In other embodiments, the transmission medium is differentially driven by various buffers, configured as the pulse shaping unit. In still other embodiments, center-tapping and/or other techniques are included.

In one set of embodiments, a system is provided for communicating pulse information. The system includes: a transmission module, configured to receive an input pulse from an input source, the input pulse having an input pulse width; and generate a driver signal as a function of the input pulse, the driver signal being generated asynchronously with respect to the input source; and a receiving module, in operative communication with the transmission module via a transmission medium, and configured to receive a three-level signal via the transmission medium as a function of the driver signal, the three-level signal including a first received pulse corresponding to a beginning of the input pulse and transitioning between a first level and a second level, and a second received pulse corresponding to an end of the input pulse and transitioning between the first level and a third level; and generate an output pulse as a function of the three-level signal, the output pulse having an output pulse width that is substantially equal to the input pulse width.

In another set of embodiments, a pulse shaping unit is provided. The pulse shaping unit includes a pulse receiver unit, operable to receive a two-level input signal including a first input pulse having a first input pulse width and a second input pulse having a second input pulse width; and a driver generator unit, operable to generate a driver signal including a first driver pulse indicating a start time of the first input pulse, a second driver pulse indicating an end time of the first input pulse, a third driver pulse indicating a start time of the second input pulse, and a fourth driver pulse indicating an end time of the second input pulse, wherein the second driver pulse follows the first driver pulse by a duration determined as a function of the first input pulse width, and the fourth driver pulse follows the third driver pulse by a duration determined as a function of the second input pulse width.

In yet another set of embodiments, a method is provided for communicating pulse information. The method includes receiving an input pulse from an input source, the input pulse having an input pulse width; generating a driver signal as a function of the input pulse and asynchronously with respect to the input source, the driver signal including a first driver pulse and a second driver pulse, the second driver pulse following the first driver pulse by a duration determined as a function of the input pulse width; communicating the driver signal over a transmission medium; receiving a three-level signal via the transmission medium, the three-level signal being functionally related to the driver signal such that the three-level signal includes a first received pulse corresponding to the first driver pulse and a second received pulse corresponding to the second driver pulse, wherein the first received pulse transitions between a first level and a second level and the second received signal transitions between the first level and a third level; and generating an output pulse as a function of the three-level signal, the output pulse having an output pulse width that is substantially equal to the input pulse width.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

FIG. 1A shows a simplified block diagram of an exemplary communication system using a transmission medium, according to various embodiments of the invention.

FIGS. 1B-1D show illustrative graphs of an input pulse signal and the effect of various pulse shaping units.

DETAILED DESCRIPTION OF THE INVENTION

Figure 2:
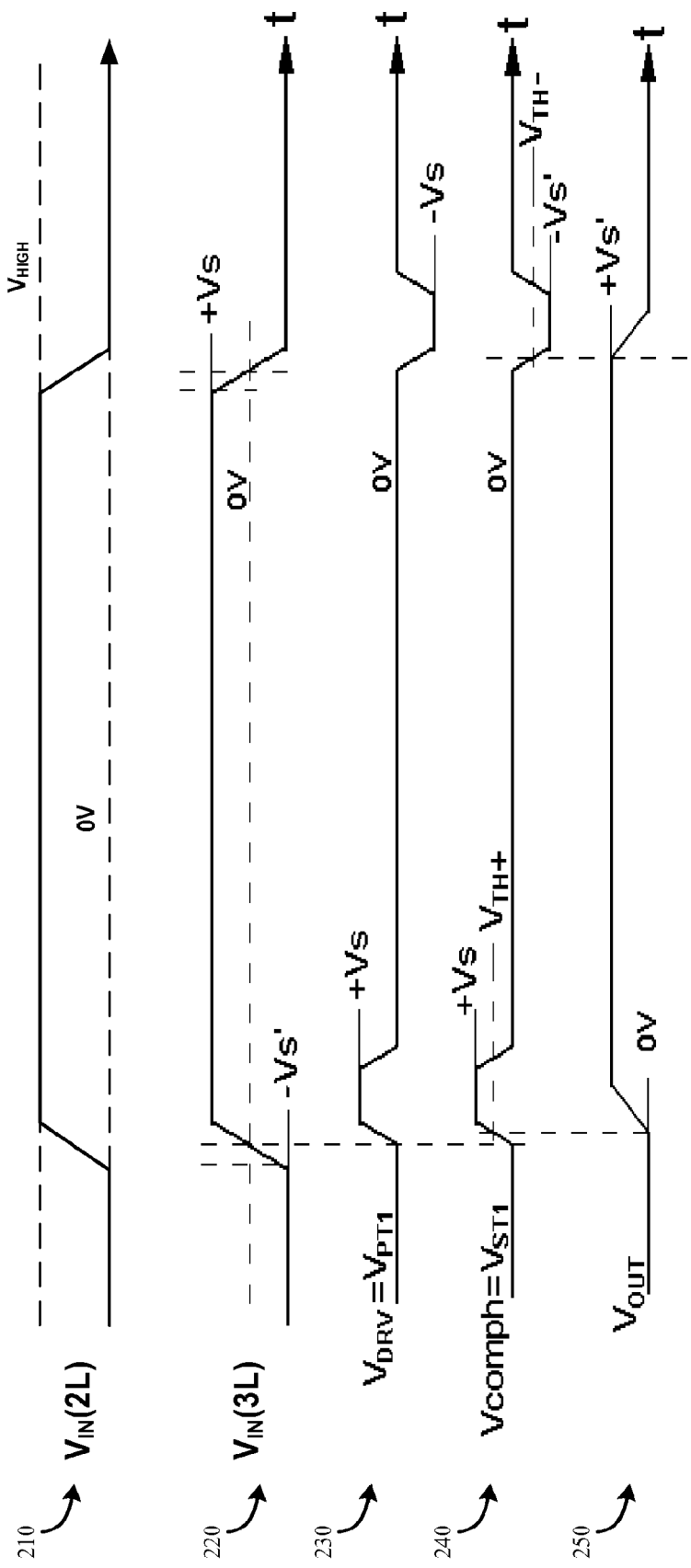
FIG. 2 shows graphs of illustrative signals read at various points in a communication system, like the communication system of FIG. 1.

Among other things, systems, devices, and methods are described for providing a transmission medium driver operable to avoid saturation, while being easily incorporated into IC processes.

Electronic systems may use various types of transmission mediums to handle communication (e.g., control) signals. Using certain types of transmission mediums, like pulse transformers or opto-isolators, may yield certain desired functionality, like the ability to adjust signal amplitude, to match impedance between a source and a load, to provide an isolation boundary between two portions of a circuit, etc. For example, a pulse transformer may be used to send a control signal from power circuitry that is connected to earth ground, across an isolation boundary, and to control circuitry that is connected to floating (e.g., chassis) ground.

It will be appreciated that embodiments are described herein with respect to various signals, but characteristics of those signals are intended only for clarity, and should not be construed as limiting the scope of the embodiments. For example, specific reference and signal voltage levels are intended merely to be examples. As such, embodiments showing signals with respect to chassis ground, floating ground, etc. may be performed using other reference voltage levels with known substitutions to the circuit topologies, where necessary.

FIG. 1A shows a simplified block diagram of an exemplary communication system using a transmission medium. The communication system 100 includes a pulse shaping unit 130, a transmission medium 140, and a pulse recovery unit 150. The pulse shaping unit 130 is connected to an input voltage source 110, which is connected to earth ground 120. The pulse recovery unit 150 generates an output voltage 160, which may be used across a load 170 connected to floating ground 180 (e.g., chassis ground). The primary side of the transmission medium 140 is connected to earth ground 120, and the secondary side of the transmission medium 140 is connected to floating ground 180.

Typically, the transmission medium 140 may be used to transmit pulse information from the input voltage source 110 to be used across the load 170. Of course, the transmission medium 140 may provide additional functionality. In some embodiments, the transmission medium 140 provides an isolation boundary between the primary side of the circuit connected to earth ground 120 and the secondary side of the circuit connected to floating ground 180. In other embodiments, the transmission medium 140 provides impedance matching between the input voltage source 110 and the load 170. In still other embodiments, the transmission medium 140 adjusts the signal amplitude, e.g., by stepping up or stepping down the voltage of the signal.

It will be appreciated that, while the transmission medium is shown and described herein largely with reference to pulse transformers, transmission mediums may include any compatible transmission mediums, including, for example, opto-isolators, coaxial cables, twisted wire pairs, circuit board traces, bus architectures, etc. As such, the phrase "transmission medium" should not be construed as limiting the invention in any way.

One consideration in the design of certain types of transmission mediums 140 may be the avoidance of saturation. For example, where the transmission medium 140 is a pulse transformer, operation of the communication system 100 may create a magnetizing force in the pulse transformer, which may generate a magnetic flux density in the core of the pulse transformer. As the flux density continues to increase, it may at some point exceed the flux capacity of the core of the pulse transformer, thereby saturating the core. Once the core has saturated, the pulse transformer may no longer operate to communicate pulse information. Thus, it may be desirable (or even critical) to avoid core saturation in order to effectively use the pulse transformer to communicate pulse information.

One way to avoid core saturation may be to use the pulse shaping unit 130 to limit the width of pulses across the primary side of the transmission medium 140. Limiting the pulse width may give the core of the transmission medium 140 time to "reset" between pulses. If the core is allowed sufficient time to reset, the flux density in the core may be kept from exceeding the flux capacity of the core, thereby avoiding core saturation. As such, embodiments of the pulse shaping unit 130 generate a drive signal for driving the transmission medium.

In some embodiments, the drive signal includes information relating to the pulse width of an input signal seen coming from the input voltage source. For example, the input signal may include a pulse width modulated ("PWM") signal having a continuously varying pulse width. In some embodiments, the drive signal includes a positive pulse at each rising edge of the input signal and a negative pulse at each falling edge of the input signal. The positive and negative pulses on the drive signal may be substantially narrow with respect to the range of PWM pulse widths on the input signal. For example, if the pulse width of the drive signal is one-percent of the period of the PWM input signal, it may be possible to reliably use the pulse shaping unit with PWM input signal pulses having close to two-percent duty cycle. It will be appreciated that embodiments of the drive signal allow of asynchronous operation (e.g., transmission of pulse information irrespective of any clock signal or of the period of the input signal), and may allow for operation of the pulse shaping unit with a wide range of PWM duty cycles.

Once the pulse width has been shaped by the pulse shaping unit 130, the pulse information may be sent across the transmission medium 140. The pulse recovery unit 150 may then be used to recover the original (unshaped) pulse information to generate the output voltage signal 160. For example, the pulse recovery unit 150 may be used to make the output voltage signal 160 substantially match the signal from the input voltage source 110. The output voltage signal 160 may then be used, e.g., to control the load 170. Of course, in certain embodiments, the output voltage signal 160 may not match the signal from the input voltage source 110. For example, the pulse shaping unit 130, transmission medium 140, and/or pulse recovery unit 150 may generate undesirable artifacts (e.g., noise, delay, etc.) or desirable artifacts (e.g., an amplitude change) between the two signals.

It will be appreciated that many types of pulse shaping units 130 are possible. FIGS. 1B-1D show illustrative graphs of an input pulse signal and the effect of various pulse shaping units. FIG. 1B shows an illustrative graph of an ideal input pulse signal 115. In some embodiments, input pulse signal 115 is similar to the signal generated by the input voltage source 110. While the input pulse signal 115 is shown as a square wave with a duty cycle of fifty percent, other input pulse signals are possible.

To avoid saturation, it may be desirable to convert the input pulse signal 115 in FIG. 1B to a signal similar to the shaped pulse signal 135-1 shown in FIG. 1C. In some embodiments, the pulse shaping unit 130 includes components operable to receive a signal similar to the input pulse signal 115 of FIG. 1B, and generate a signal similar to the shaped pulse signal 135-1 of FIG. 1C. Those of skill in the art will appreciate that complex circuitry may be typical for generating the shaped pulse signal 135-1 of FIG. 1C. For example, timing circuits, filters, and other components may be used. Using complex circuitry may increase the cost and complexity of IC design and production and may produce other undesirable artifacts (e.g., increased propagation delay of the pulse transformer driver).

Other types of pulse shaping units 130 (that may avoid the complexity and/or cost of generating signals like the shaped pulse signal 135-1 of FIG. 1C) use DC blocking capacitors. By providing a DC blocking capacitor prior to the transmission medium 140, each pulse may effectively be shortened. FIG. 1D shows an illustrative graph of a shaped pulse signal using a DC blocking capacitor. The shaped pulse signal 135-2 of FIG. 1D may not have the ideal characteristics of the shaped pulse signal 135-1 of FIG. 1C, but may still be sufficient to avoid core saturation. To be effective in certain applications, however, the DC blocking capacitor may have to be very large (e.g., 1,000 pf to 20,000 pf in value), potentially making it difficult or even impossible to incorporate into a typical integrated circuit ("IC"). For some applications, it may be desirable for the pulse shaping unit 130 to be operable within typical IC processes, without being costly and/or complex.

Figure 5:
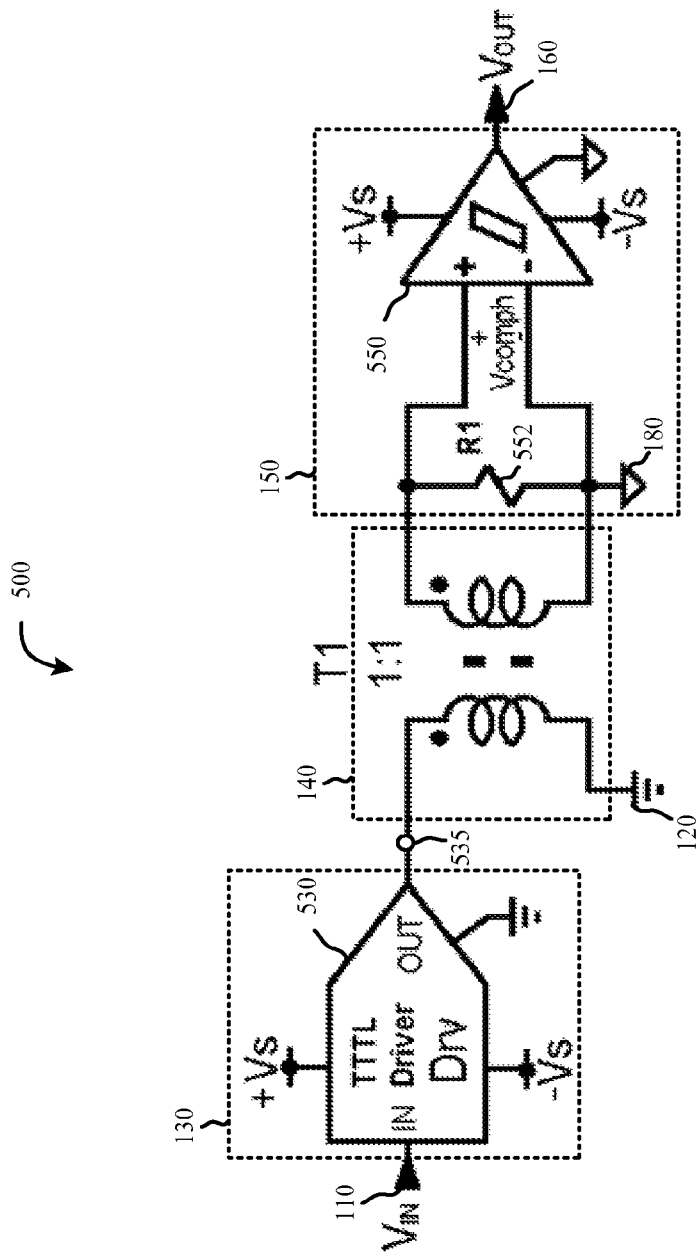
FIG. 5 shows a schematic of an exemplary communication system using a pulse transformer, according to various embodiments of the invention.
Figure 8:
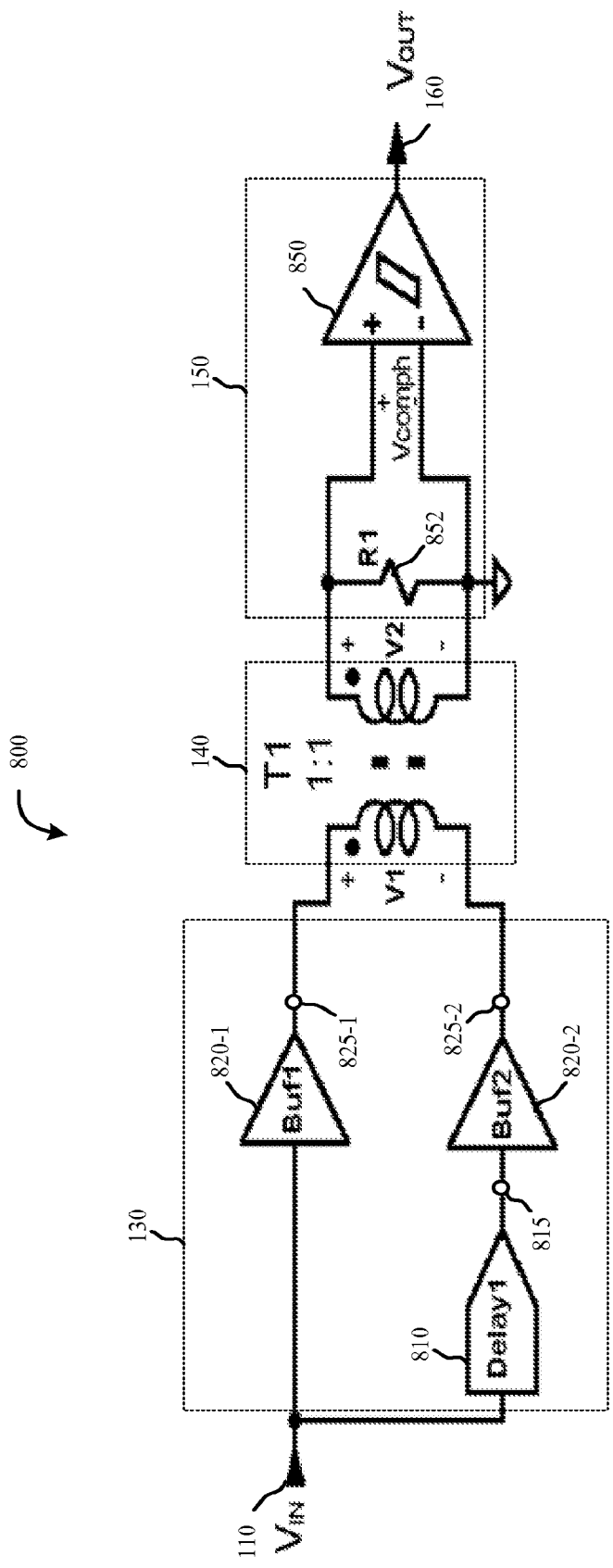
FIG. 8 shows a schematic of an exemplary communication system using a differentially driven pulse transformer, according to various embodiments of the invention.
Figure 10A:
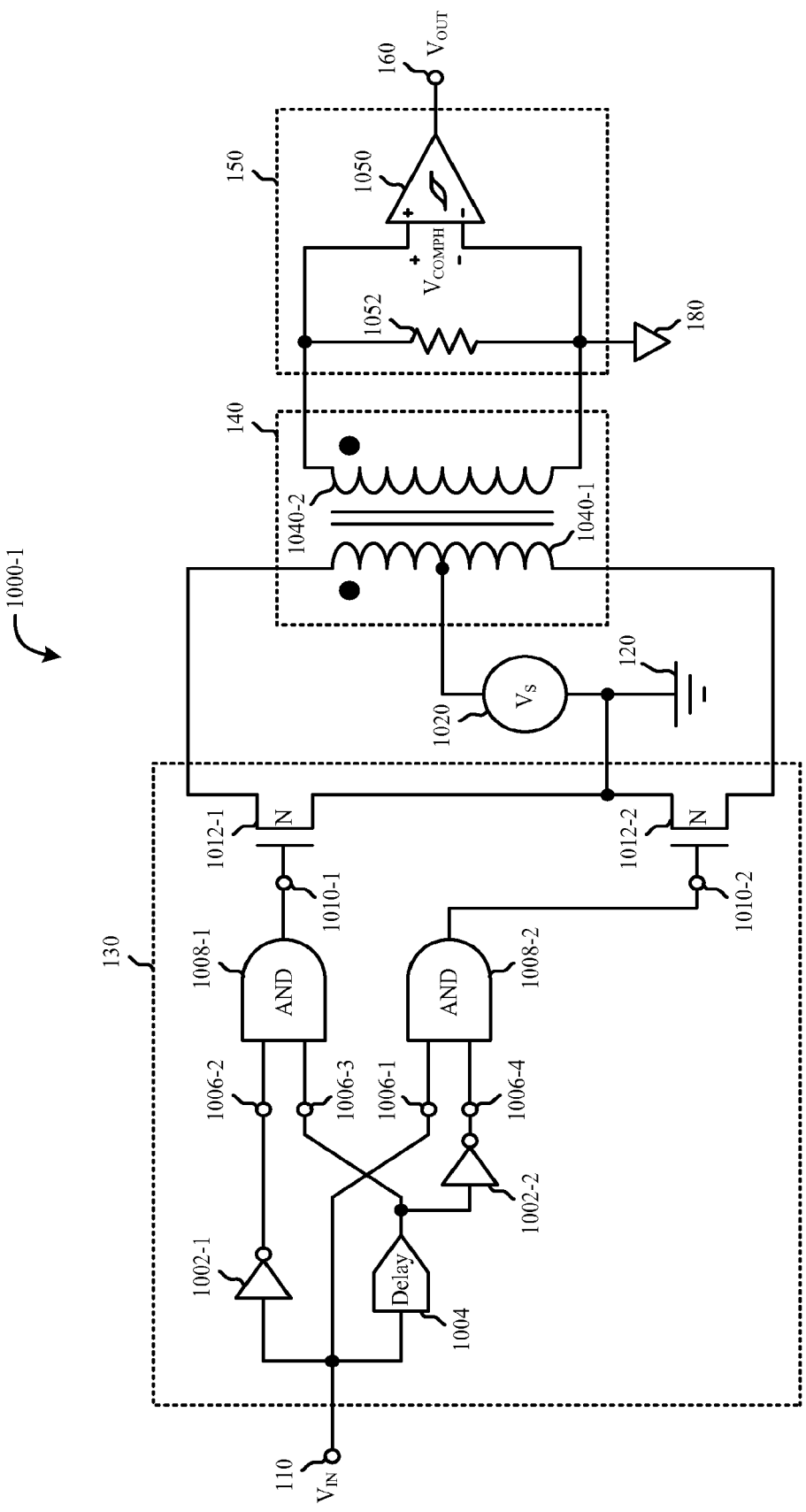
FIGS. 10A and 10B show exemplary communication systems using center-tapped pulse transformers, according to various embodiments of the invention.
Figure 10B:
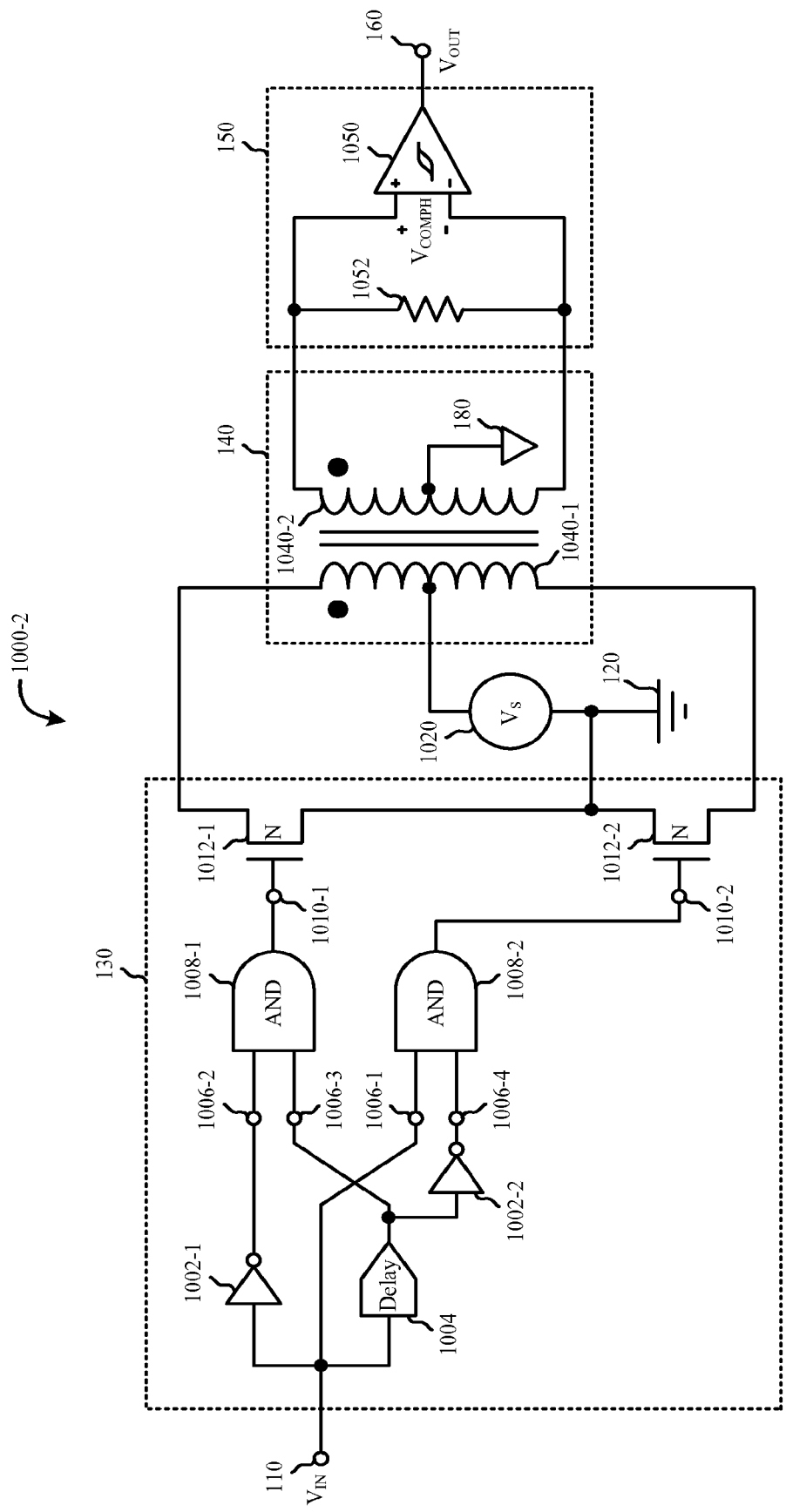

Embodiments of the invention provide pulse shaping units 130 that may fit within typical IC processes. In some embodiments, a two-to-three level ("TTTL") driver unit is provided (e.g., as shown in FIG. 5) as a pulse shaping unit 130. In other embodiments, the transmission medium 140 is differentially driven by various buffers (e.g., as shown in FIG. 8) to effectively work as a pulse shaping unit 130. In still other embodiments, a center-tapping technique is used to drive the transmission medium 140 with a three-level drive signal (e.g., as shown in FIGS. 10A and 10B). It will be appreciated that other types of pulse shaping units 130 are possible, e.g., for generating a three-level driver signal for transmitting pulse information across the transmission medium 140.

FIG. 2 shows graphs of illustrative signals read at various points in a communication system, like the communication system 100 of FIG. 1. The first graph 210 shows one pulse of the input signal coming from the input voltage source 110. In some embodiments, the input signal goes from zero volts to some logical high voltage level ("$V_{HIGH}$"). The pulse shaping unit 130 receives the two-level input signal and converts the two-level input signal to a shifted input signal, as shown in the second graph 220. The second graph 220 shows the shifted input voltage signal going from a negative source voltage ("$-V_S$") to a positive source voltage ("$+V_S$"). It is worth noting that, aside from the voltage level shift, the pulse information may be substantially preserved as the two-level input voltage signal is converted to the shifted input voltage signal.

The pulse shaping unit 130 may then use the shifted input voltage signal to generate a three-level driver signal. The third graph 230 shows that the three-level driver signal may essentially include a relatively short positive driving pulse at the start of each input pulse in the shifted input voltage signal (e.g., where the shifted input voltage signal crosses zero volts in the positive direction), and a relatively short negative driving pulse at the end of each input pulse in the shifted input voltage signal (e.g., where the shifted input voltage signal crosses zero volts in the negative direction). For the time between each positive and negative pulse, the three-level driver signal remains at zero volts, thereby creating three distinct levels. For example, the three-level driver signal may be at either $-V_S$, $+V_S$, or 0V, at any point in time, except during brief times where the three-level driver signal is transitioning between levels.

The third graph 230 shows that the output of the pulse shaping unit 130 (i.e., the three-level driver signal) may tend to rest at zero volts for a relatively large percentage of each input pulse cycle, a time period that may be much greater than the time period where the three-level driver signal is at either $+V_S$ or $-V_S$. In this way, it may be possible to ensure that the transmission medium 140 does not saturate. In some embodiments, the pulse width of the three-level driver signal is designed to be as short as possible (e.g., as short as practical for a pulse transformer being used). In certain embodiments, shortening the pulse width of the three-level driver signal helps maximize the bandwidth of the communication system 100.

The three-level driver signal may be passed across the transmission medium 140 to the pulse recovery unit 150. An examination of the third graph reveals certain artifacts of the three-level driver signal. One such artifact is that, rather that the pulses beginning and ending as sharp square pulses, there may be a rise time and/or a fall time associated with each pulse. In some cases, the rise and/or fall times may contribute noise to the communication system 100, referred to as "dV/dt noise." The dV/dt noise may arise, for example, from non-ideal aspects of one or more components of a circuit or from signal differences between the sides of a transformer (e.g., where there is a difference between signals sitting at earth ground (0V) on the primary side and floating ground on the secondary side).

One embodiment of the communication system 100 includes a switched-mode power supply ("SMPS"). The SMPS operates to switch between zero and six-hundred volts at approximately fifty volts-per-nanosecond (i.e., it takes approximately thirty nanoseconds to transition from zero to six-hundred volts). This rise time may be due, e.g., to non-ideal characteristics of the transmission medium 140, like capacitance between the primary and secondary sides. Say, for example, the capacitance across the transmission medium 140 is one picofarad. The voltage change across a capacitor may be calculated by the following equation:

$$\Delta V = \frac{1}{C} I \Delta t,$$

which may be rearranged as $$I = \frac{\Delta V}{\Delta t} C,$$

where V is the voltage across the capacitor, C is the capacitance of the capacitor, I is the current through the capacitor, and t is time. From this equation, it can be shown that the capacitance across the transformer may generate a current of around fifty milliamps (i.e., where $\Delta V/\Delta t = 50 V/ns$, and $C=1$ pf). If the load on the secondary side of the transmission medium 140 is fifty ohms, Ohm's law dictates that the load may see a voltage drop of up to around 2.5 volts due to the capacitance across the transformer (i.e., V=IR=(50 mA)(50Ω)=2.5V). This 2.5-volt drop may manifest as dV/dt noise in the communication system 100.

In many applications, it may be desirable to ignore, or otherwise handle, the dV/dt noise, and other artifacts of the system (including, e.g., electromagnetic interference). For example, it may be desirable or even necessary to ensure that noise is not misinterpreted as pulses by the system. Otherwise, the output voltage 160 may not accurately represent the pulse information from the input voltage signal 110. As such, some embodiments of the invention use a hysteresis comparator (e.g., as part of the pulse recovery unit 150) to help recover the pulse information from the input voltage signal 110 in the presence of noise.

As described in more detail below, the hysteresis comparator may be implemented as a comparator that transitions its output from low to high when its differential input exceeds a positive threshold value, and transitions its output from high to low when its differential input falls below a negative threshold value. Typically, the positive and negative threshold values are set to have absolute values greater than zero, so that relatively small voltage fluctuations around zero volts will not cause the hysteresis comparator to transition. The fourth graph 240 shows an overlay of illustrative positive and negative threshold values on the three-level driver signal shown in the third graph 230. The fifth graph 250 shows an illustrative output of a hysteresis comparator having the input signal and positive and negative threshold values shown in the fourth graph 240. As shown in the fifth graph 250, the output of the hysteresis comparator transitions when the three-level driver signal crosses the positive or negative threshold value. This may provide a two-level output signal (shown in the fifth graph 250) that is a function of the two-level input signal (shown in the first graph 210).

Figure 3:
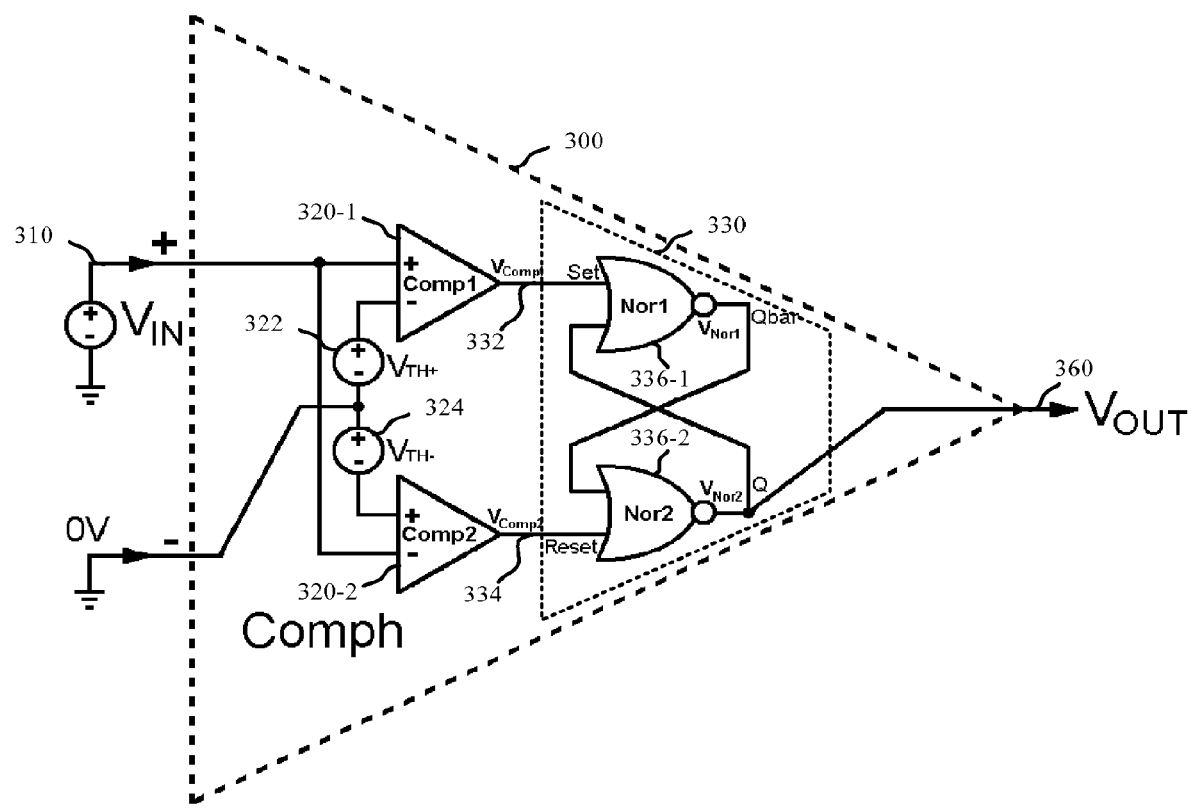
FIG. 3 shows a simplified schematic of an illustrative hysteresis comparator, for use with various embodiments of the invention.
Figure 4:
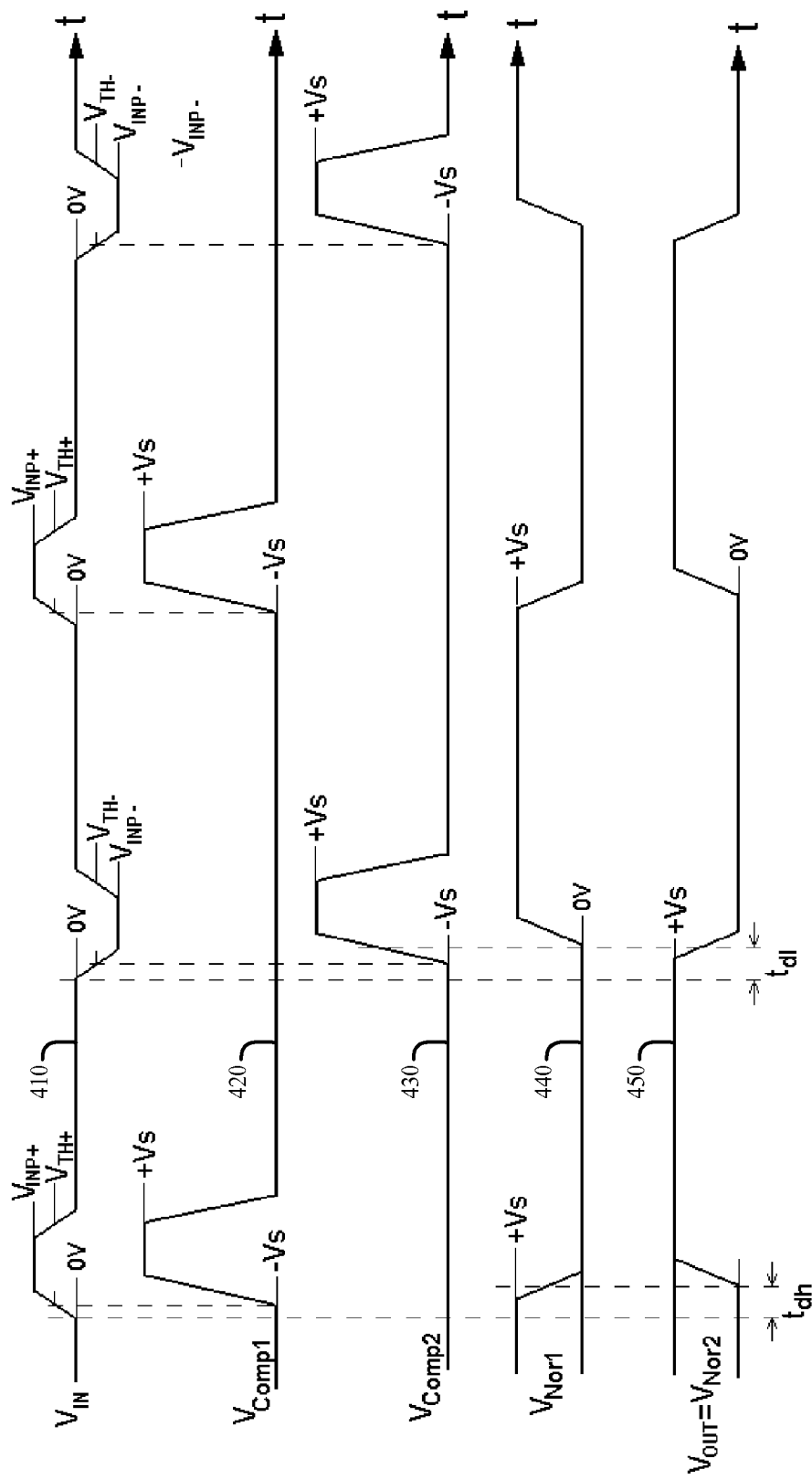
FIG. 4 shows graphs of illustrative signals read at various points in the hysteresis comparator of FIG. 3.

It will be appreciated that the hysteresis comparator may be implemented in various ways according to embodiments of the invention. FIG. 3 shows a simplified schematic of an illustrative hysteresis comparator, for use with various embodiments of the invention. FIG. 4 shows graphs of illustrative signals read at various points in the hysteresis comparator 300 of FIG. 3. For added clarity, FIGS. 3 and 4 are described in parallel.

In some embodiments, a three-level output voltage signal is sent across a pulse transformer and into the hysteresis comparator 300 as an input voltage 310. The input voltage waveform is shown in the first graph 410 of FIG. 4. In particular embodiments, the hysteresis comparator 300 includes two standard comparators, Comp1 320-1 and Comp2 320-2. Comp1 320-1 is operable to monitor a positive threshold voltage 322 of $V_{TH+}$, and Comp2 320-2 is operable to monitor a negative threshold voltage 324 of $V_{TH-}$. The comparators 320 drive an internal latch 330, having a Set input 332 and a Reset input 334. In one embodiment, the internal latch 330 includes two NOR logic gates 336 configured so that the output of the first NOR logic gate 336-1 feeds into one input of the second NOR logic gate 336-2, and the other inputs of the NOR logic gates 336 are the Set input 332 and Reset input 334. The output of the second NOR logic gate 336-2 may be used as an output voltage 360 of the hysteresis comparator 300.

When the input voltage 310 exceeds the positive threshold voltage 322, Comp1 320-1 may provide a positive going pulse into the Set input 332, as illustrated by the second graph 420 of FIG. 4. When the input voltage 310 drops below the negative threshold voltage 324, Comp2 320-2 may provide a negative going pulse into the Reset input 334, as illustrated by the third graph 430 of FIG. 4. The fifth graph 450 of FIG. 4 shows that providing the positive going pulse into the Set input 332 may drive the output voltage 360 to a HIGH state. The internal latch 330 may then hold the output voltage 360 at the HIGH state until the negative going pulse is provided into the Reset input 334. At this point, the output voltage 360 may transition to a LOW state.

A number of aspects of embodiments of the invention may be appreciated by looking at the various graphs in FIG. 4. One such aspect is that, because transitions in the output voltage 360 only occur when a threshold voltage (322 or 324) is crossed, voltage fluctuations around zero volts that do not exceed the threshold voltages (322 and 324) may not affect the output voltage 360. As such, the threshold voltages (322 and 324) may be set so that voltage fluctuations due to noise are essentially ignored (i.e., they are not apparent in the output voltage 360. Another such aspect is that, if the voltage thresholds (322 and 324) are not set to zero volts, the threshold crossing points of the output voltage 360 may be delayed from the zero crossing points of the input voltage signal 310. This may cause a delay pulse information in the output voltage signal 360 to be delayed from the pulse information in the input voltage signal 310. It will be appreciated that, because of the configuration of the components of the hysteresis comparator 300 and/or the other components interfacing with the hysteresis comparator 300, the delay may be variable (i.e., not consistent). It may, therefore, be difficult or even impossible to easily account for the delay using additional components.

Returning to FIG. 2, the fourth graph 240 and the fifth graph 250 show the input and the output to the pulse recovery unit 150, respectively. While the fourth graph 240 and the fifth graph 250 represent embodiments of the pulse recovery unit 150 that use a hysteresis comparator, other graphs may result from other types of pulse recovery units 150. The input, shown in the fourth graph 240, may be the voltage induced across the secondary side of the transmission medium 140 by the three-level driver signal, which may substantially mimic the three-level driver signal. As shown in the fifth graph 250, when the input to the pulse recovery unit 150 exceeds a positive threshold value ("$V_{TH+}$"), the output of the pulse recovery unit 150 may transition to a logical HIGH. The output of the pulse recovery unit 150 may then remain at logical HIGH until the input to the pulse recovery unit 150 crosses a negative threshold value ("$V_{TH-}$"). At this point, the output of pulse recovery unit 150 may transition to a logical LOW.

The output of the pulse recovery unit 150 may then be passed as the output voltage 160 of the communication system 100. It will be appreciated that, depending on the components, signals, and other characteristics of the communication system 100 and the application in which it is being used, the output voltage 160 (e.g., as shown in the fifth graph 250) may differ from the input signal coming from the input voltage source 110 (e.g., as shown in the first graph 210). For example, there may be delay, noise, change in amplitude, etc. It will now be appreciated that providing the communication system 100 with the pulse shaping unit 130 may allow the output voltage 160 to substantially preserve the pulse information of the input signal.

Exemplary Pulse Shaping Unit Embodiments

As mentioned above, many types of pulse shaping units are possible for use with embodiments of the invention. Some of these types of pulse shaping units are described in more detail in the following figures.

FIG. 5 shows a schematic of an exemplary communication system using a pulse transformer, according to various embodiments of the invention. The communication system 500 includes a pulse shaping unit 130, a transmission medium 140, and a pulse recovery unit 150. The pulse shaping unit 130 includes a two-to-three level ("TTTL") driver unit 530, the transmission medium 140 includes a pulse transformer 540, and the pulse recovery unit 150 includes a hysteresis comparator 550 and a resistor 552.

The TTTL driver unit 530 receives a two-level input voltage signal 110 (e.g., high/low), converts the two-level input voltage signal 110 to a shifted input voltage signal, and uses the shifted input voltage signal to generate a three-level driver signal 535. The three-level driver signal 535 is passed across the pulse transformer 540 to the hysteresis comparator 550. The hysteresis comparator 550 generates an output voltage 160.

It is worth noting that the hysteresis comparator 550 is shown in FIG. 5 in a single-ended configuration (i.e., one input terminal is tied to ground). Various embodiments of the invention may alternatively configure the hysteresis comparator 550 to be differentially driven (i.e., both input terminals are tied to input voltages). By differentially driving the hysteresis comparator 550, it may be possible to convert noise and other artifacts (e.g., dv/dt noise) into common-mode noise. By converting to common-mode noise, the hysteresis comparator 550 may be able to use common-mode rejection (e.g., often by a factor of 100 times or more) as long as the hysteresis comparator 550 does not run out of common-mode range. For example, while 2.5-volt dV/dt noise may be greater than the hysteresis of the hysteresis comparator 550 (e.g., where the hysteresis is set to around 0.25 volts), common mode rejection may allow the hysteresis comparator 550 to reject up to +/−6 volts while remaining within the common-mode range of a typical comparator design.

In some embodiments, one side of the primary winding of the pulse transformer 540 is driven with one output of the TTTL driver unit 530 and the other side of the primary winding of the pulse transformer 540 is driven with a complementary output of the TTTL driver unit 530. Driving the pulse transformer 540 in this way may increase noise rejection of the communication system 500 (e.g., by a factor of two). In other embodiments, a center-tapped configuration is used in the secondary of the pulse transformer 540, as described in more detail with respect to FIGS. 10A, 10B, and 11. In certain embodiments, a Faraday shield may also be used with the pulse transformer 540, for example to improve dV/dt noise rejection.

Figure 6:
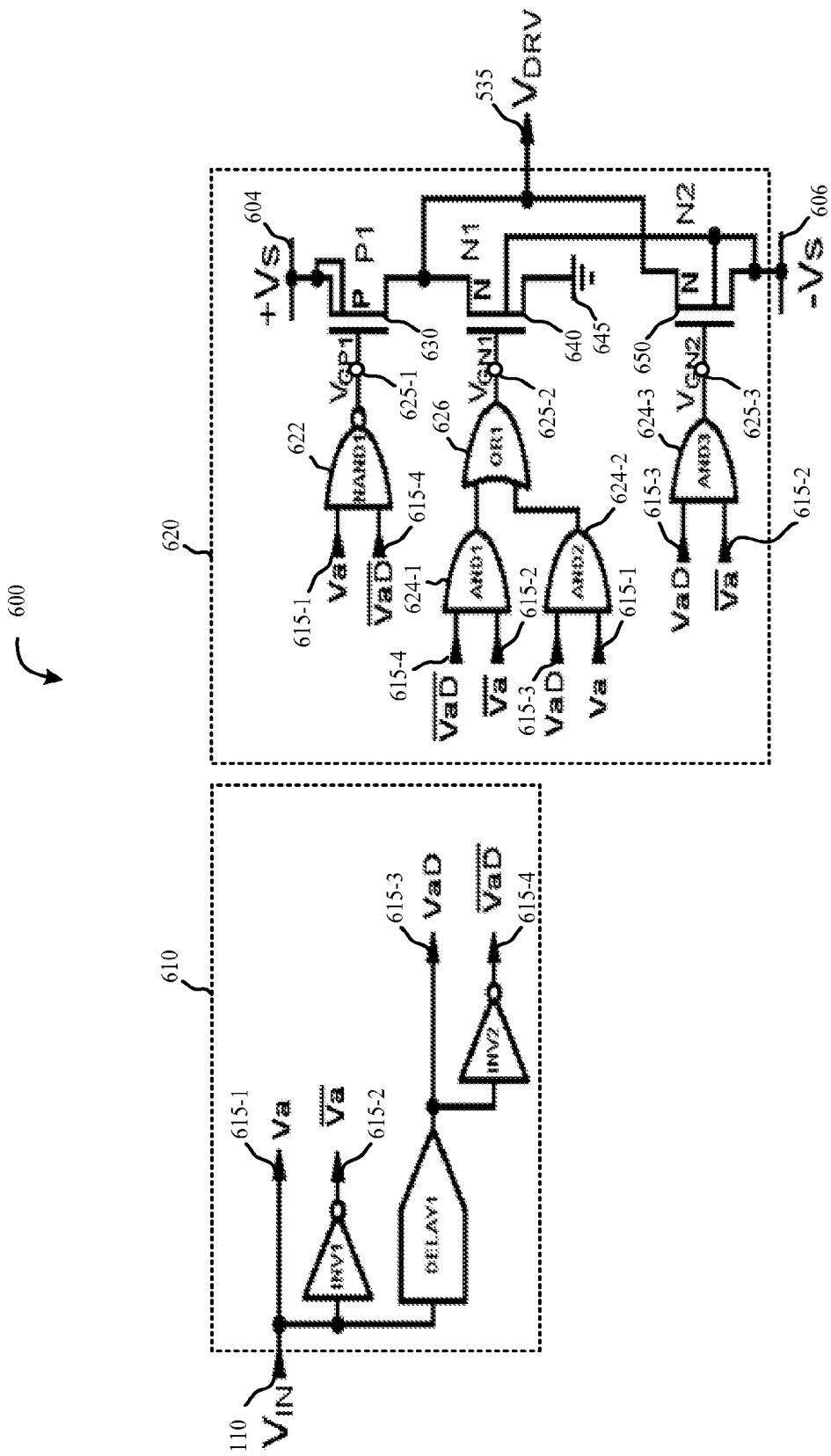
FIG. 6 shows a schematic of an illustrative TTTL driver unit, according to various embodiments of the invention.

FIG. 6 shows a schematic of an illustrative TTTL driver unit, according to various embodiments of the invention. In some embodiments, the TTTL driver unit 600 is the TTTL driver unit 530 of FIG. 5. The TTTL driver unit 600 includes a signal generation unit 610 and a logic processing unit 620. In one embodiment, the signal generation unit 610 is operable to receive a two-level input voltage signal 602 (e.g., the two-level input voltage signal 510 of FIG. 5), and generate four logic control signals: Va 615-1, $Va_{INV}$ 615-2, VaD 615-3, and $VaD_{INV}$ 615-4. Signal Va 615-1 may substantially match the two-level input voltage signal 602, and signal $Va_{INV}$ 615-2 may substantially be the inverse of the two-level input voltage signal 602. Signal VaD 615-3 may substantially be a delayed version of the two-level input voltage signal 602, and signal $VaD_{INV}$ 615-4 may substantially be a delayed version of the inverse of the two-level input voltage signal 602.

The four logic control signals 615 are passed to various logic components (e.g., transistor-transistor logic gates) in the logic processing unit 620, which generate three transistor control signals 625: signal $V_{GP1}$ 625-1, signal $V_{GN1}$ 625-2, and signal $V_{GN2}$ 625-3. As shown, signal $V_{GP1}$ 625-1 is generated by performing a logical NAND operation on signal Va 615-1 and signal $VaD_{INV}$ 615-4 (e.g., using a NAND gate 622). Signal $V_{GN1}$ 625-2 is generated by performing a logical AND on signal $Va_{INV}$ 615-2 and signal $VaD_{INV}$ 615-4 to generate a first intermediate output (e.g., using a first AND gate 624-1), performing a logical AND on signal Va 615-1 and signal VaD 615-3 to generate a second intermediate output (e.g., using a second AND gate 624-2), and performing a logical OR on the first intermediate output and the second intermediate output (e.g., using an OR gate 626). Signal $V_{GN2}$ 625-3 is generated by performing a logical AND on signal $Va_{INV}$ 615-2 and signal VaD 615-3 (e.g., using a third AND gate 624-3). It will be appreciated that the logic shown may be implemented in a number of ways to generate substantially the same transistor control signals 625.

Signal $V_{GP1}$ 625-1 may control the gate voltage of a P-type transistor 630. P-type transistor 630 may be configured such that its source and its body are connected to a positive source voltage 604 (e.g., "$+V_S$"), and its drain is connected to a drive voltage terminal 535 (e.g., a pin on an IC, a bus, etc.). Signal $V_{GN1}$ 625-2 may control the gate voltage of a first N-type transistor 640. The first N-type transistor 640 may be configured such that its drain is connected to ground 645, its body is connected to a negative source voltage 606 (e.g., "$-V_S$"), and its source is connected to the drive voltage terminal 535. Signal $V_{GN2}$ 625-3 may control the gate voltage of a second N-type transistor 650. The second N-type transistor 650 may be configured such that its drain and its body are connected to the negative source voltage, and its source is connected to the drive voltage terminal 535.

It will be appreciated that other topologies are possible for generating a drive voltage at the drive voltage terminal, according to embodiment of the invention. For example, N-type devices may be used in place of P-type devices (e.g., and vise versa), with modifications to the signal logic driving those devices (e.g., the logic used to generate the transistor control signals 625), without substantially affecting the resulting driver signal at the drive voltage terminal 535. In various embodiments, the drive voltage terminal 535 is configured to provide its voltage as a three-level driver signal, as illustrated in FIG. 7.

Figure 7:
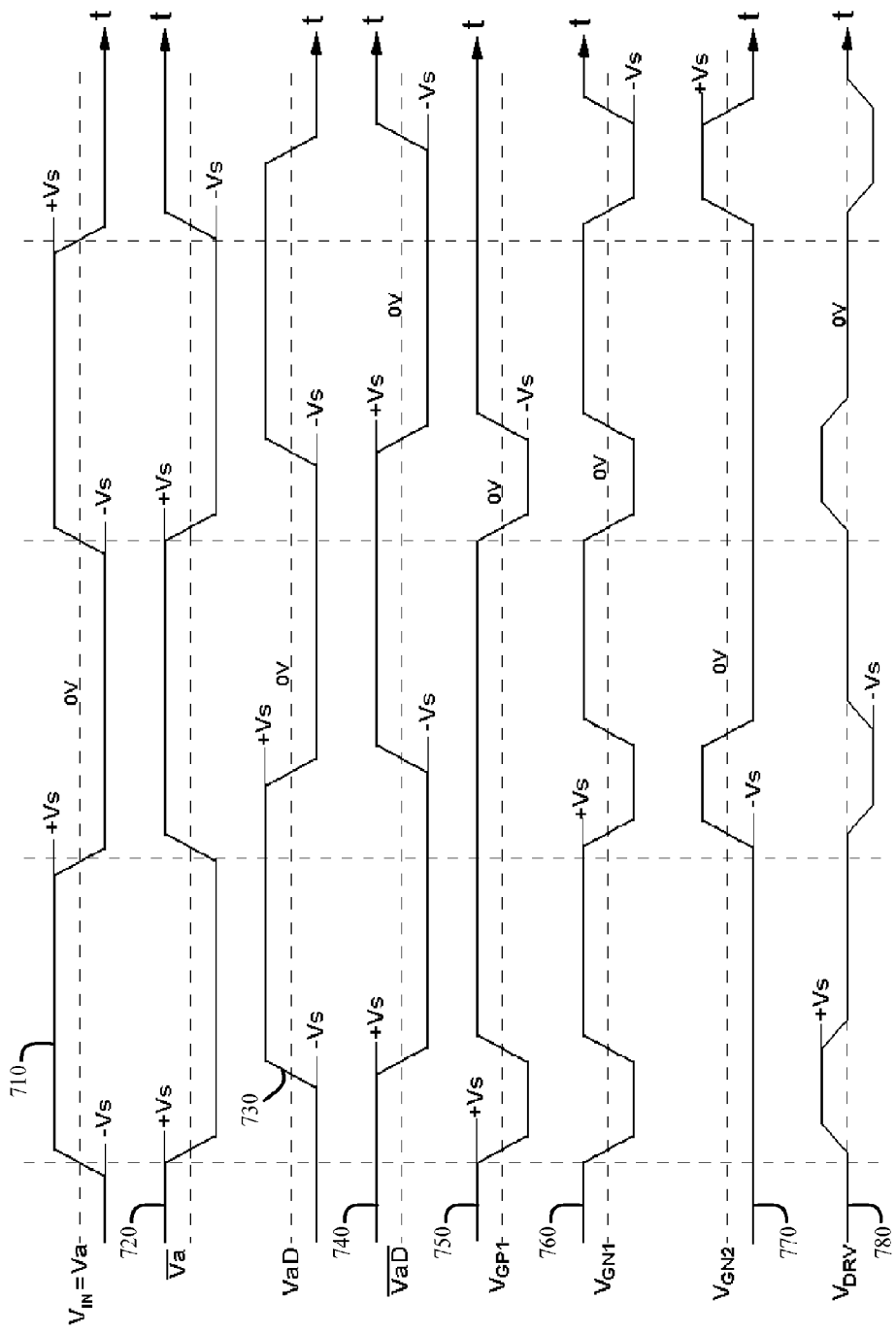
FIG. 7 shows graphs of illustrative signals read at various points in the TTTL driver unit of FIG. 6.

FIG. 7 shows graphs of illustrative signals read at various points in the TTTL driver unit 600 of FIG. 6. The first graph 710 shows two pulse cycles of the two-level input voltage signal 110, shifted to go from a negative source voltage ("$-V_S$") to a positive source voltage ("$+V_S$"). The first graph 710 further indicates that the two-level input voltage signal 110 is substantially equivalent to signal Va 615-1. The second graph 720, the third graph 730, and the fourth graph 740 show signal Va$_{INV}$ 615-2, signal VaD 615-3, and signal VaD$_{INV}$ 615-4, respectively.

As shown in FIG. 6, signal $V_{GP1}$ 625-1 may be generated by passing signal Va 615-1 and signal VaD$_{INV}$ 615-4 through NAND logic (e.g., NAND gate 622). According to the NAND logic, signal $V_{GP1}$ 625-1 (i.e., the gate voltage of the P-type transistor 630) may be HIGH, except when both signal Va 615-1 and signal VaD$_{INV}$ 615-4 are high. The fifth graph 750 shows these transitions of signal $V_{GP1}$ 625-1. Signal $V_{GN1}$ 625-2 may be generated by passing signal Va 615-1 and signal VaD 615-4 through first AND logic (e.g., first AND gate 624-1), passing signal Va$_{INV}$ 615-2 and signal VaD$_{INV}$ 615-4 through second AND logic (e.g., second AND gate 624-2), and passing the results of the first AND logic and the second AND logic through OR logic (e.g., OR gate 626). According to the AND and OR logic, signal $V_{GN1}$ 625-2 (i.e., the gate voltage of the first N-type transistor 640) may be HIGH, only when either signal Va 615-1 and signal VaD 615-4 are high or when signal Va$_{INV}$ 615-2 and signal VaD$_{INV}$ 615-4 are high. The sixth graph 760 shows these transitions of signal $V_{GN1}$ 625-2. Signal $V_{GN2}$ 625-3 may be generated by passing signal Va$_{INV}$ 615-2 and signal VaD 615-3 through third AND logic (e.g., third AND gate 624-3). According to the AND logic, signal $V_{GN2}$ 625-3 (i.e., the gate voltage of the second N-type transistor 650) may be HIGH, only when both signal Va$_{INV}$ 615-2 and signal VaD 615-3 are high. The sixth graph 760 shows these transitions of signal $V_{GN2}$ 625-3.

It will be appreciated that signal $V_{GP1}$ 625-1, signal $V_{GN1}$ 625-2, and signal $V_{GN2}$ 625-3 may essentially be representations of the pulse information from the two-level input voltage signal 110 with shortened pulse widths. It will further be appreciated that the width of the pulses depends, at least in part, on the amount of delay introduced into the system in the signal generation unit 610. For example, short pulses may be used to provide compatibility with PWM input signals having a wide range of duty cycles. By generating the three transistor control signals 625, the gate voltages of the three transistors, P-type transistor P1 630, first N-type transistor N1 640, and second N-type transistor N2 650, may be controlled, thereby controlling the output drive voltage.

Referring to the circuit shown in FIG. 6, when signal $V_{GP1}$ 625-1 is at or near the positive source voltage 604 (e.g., "$+V_S$" or "HIGH"), the gate-source voltage of P-type transistor 630 may be at or near zero volts because its body is tied to the positive source voltage 604. Because P-type transistor 630 is a P-channel transistor, this may cause P-type transistor 630 to be OFF (i.e., not allowing current to flow) while signal $V_{GP1}$ 625-1 is HIGH. Alternately, P-type transistor 630 may be ON (i.e., conducting) when signal $V_{GP1}$ 625-1 is LOW, thereby pulling the three-level output voltage signal up substantially to the positive source voltage 604.

When signal $V_{GN1}$ 625-2 is at or near the negative source voltage 606 (e.g., "$-V_S$" or "LOW"), the gate-source voltage of the first N-type transistor 640 may be at or near zero volts because its body is tied to the negative source voltage 606. Because the first N-type transistor 640 is an N-channel transistor, this may cause the first N-type transistor 640 to be ON while signal $V_{GN1}$ 625-2 is HIGH, thereby pulling the three-level output voltage signal substantially to ground 645. Alternately, the first N-type transistor 640 may be OFF while signal $V_{GN1}$ 625-2 is LOW.

When signal $V_{GN2}$ 625-3 is at or near the negative source voltage 606, the gate-source voltage for the second N-type transistor 650 may be at or near zero volts because its body is tied to the negative source voltage 606. Because the second N-type transistor 650 is an N-channel transistor, this may cause the second N-type transistor 650 to be ON while signal $V_{GN2}$ 625-3 is HIGH, thereby pulling the three-level output voltage signal substantially to the negative source voltage 606. Alternately, the second N-type transistor 650 may be OFF while signal $V_{GN2}$ 625-3 is LOW.

It will be appreciated that the logic may be designed to ensure that only one of signal $V_{GP1}$ 625-1, signal $V_{GN1}$ 625-2, or signal $V_{GN2}$ 625-3 is HIGH at any point in time. In this way, there may be no situation in which the positive source voltage 604 is shorted to ground 645 or to the negative source voltage 606. This may be seen by comparing the fifth graph 750, the sixth graph 760, and the seventh graph 770. The eighth graph 780 shows the three-level output voltage signal generated by the three transistors, P-type transistor 630, first N-type transistor 640, and second N-type transistor 650. In some embodiments, as shown, the three-level output drive voltage signal essentially includes a positive pulse at each positive zero crossing of the two-level input voltage signal 110, a negative pulse at each negative zero crossing of the two-level input voltage signal 110, and a zero level everywhere else. In this way, it will now be apparent that the three-level output drive voltage signal may essentially include a three-level representation of the pulse information from the two-level input voltage signal 110 (though possibly with additional artifacts, like delay).

As described above, embodiments of the TTTL driver unit (e.g., 530 of FIG. 5) generate a three-level driver signal across the primary side of a pulse transformer, where the one side of the primary winding of the pulse transformer is tied to ground. Alternatively, other embodiments of pulse shaping units differentially drive the pulse transformer (i.e., one side of the primary winding is not tied to ground) to effectively generate the three-level driver signal.

FIG. 8 shows a schematic of an exemplary communication system using a differentially driven pulse transformer, according to various embodiments of the invention. The communication system 800 includes a pulse shaping unit 130, a transmission medium 140, and a pulse recovery unit 150. The pulse shaping unit 130 includes a first buffer unit 820-1, and a second buffer unit 820-2 driven by a delay unit 810. The transmission medium 140 includes a pulse transformer driven differentially by the buffer units 820. The pulse recovery unit 150 includes a hysteresis comparator 850 and a resistor 852.

The first buffer unit 820-1 is operable to receive a two-level input voltage signal 110 (e.g., high/low), buffer the two-level input voltage signal 110, and generate a first buffered driver signal 825-1. The second buffer unit 820-2 is operable to receive a delayed two-level input voltage signal 815 (i.e., the two-level input voltage signal 110 with an added delay created by the delay unit 810), buffer the delayed two-level input voltage signal 815, and generate a second buffered driver signal 825-2. The first buffered driver signal 825-1 and the second buffered driver signal 825-2 are used to differentially drive the transmission medium 140, effectively generating a three-level driver signal. The three-level driver signal is passed across the transmission medium 140 to the hysteresis comparator 850, which generates an output voltage 160.

Figure 9:
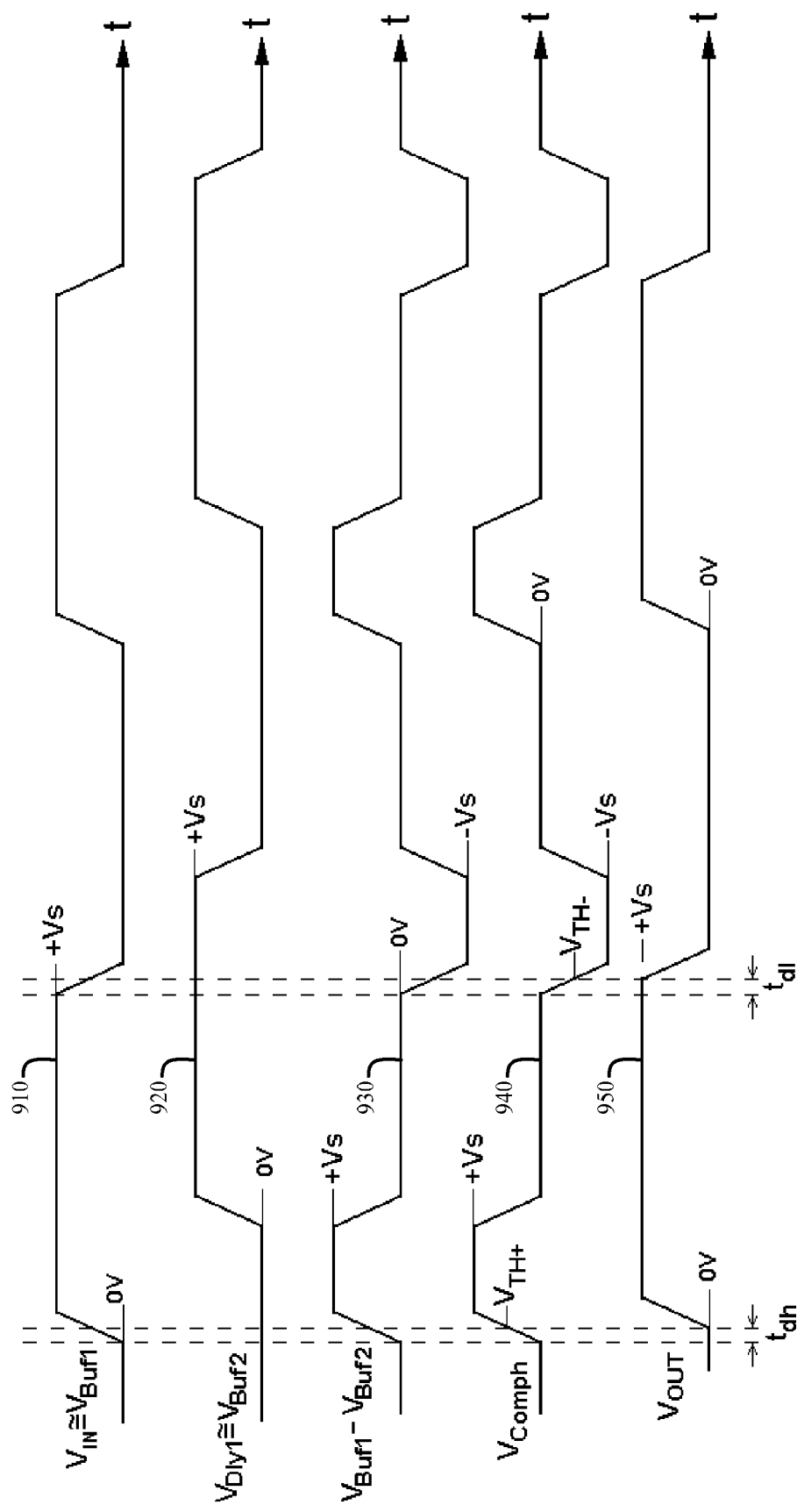
FIG. 9 shows graphs of illustrative signals read at various points in the communication system of FIG. 8.

FIG. 9 shows graphs of illustrative signals read at various points in the communication system 800 of FIG. 8. The first graph 910 shows two pulse cycles of the two-level input voltage signal 110, going from zero volts to a positive source voltage ("+$V_S$"). The first graph 910 further indicates that the two-level input voltage signal 110 may be substantially equivalent to the first buffered driver signal 825-1 generated by the first buffer unit 820-1. The second graph 920 shows two pulse cycles of the delayed two-level input voltage signal 815, going from zero volts to a positive source voltage ("+$V_S$"). The second graph 920 further indicates that the delayed two-level input voltage signal 815 is substantially equivalent to the second buffered driver signal 825-2 generated by the second buffer unit 820-2.

The third graph 930 shows the differential signal resultant at the primary side of the transmission medium 140 (e.g., the pulse transformer) from the differential use of the two buffered driver signals 825. Because the transmission medium 140 is driven differentially by the buffered driver signals 825 (e.g., the first buffered driver signal 825-1 drives one side of the primary winding of the pulse transformer and the second buffered driver signal 825-2 drives the other side of the primary winding of the pulse transformer), the transmission medium 140 may effectively see a voltage across its primary side that is substantially equivalent to the difference between the two buffered driver signals 825. As such, the transmission medium 140 may only transmit (e.g., the pulse transformer may only operate as a transformer) when the difference between the voltages of the two buffered driver signals 825 is not equal to zero. Further, as shown in the third graph 930, the primary side of the transmission medium 140 effectively sees a positive driving pulse when the first buffered driver signal 825-1 is greater than the second buffered driver signal 825-2, and a negative driving pulse when the first buffered driver signal 825-1 is less than the second buffered driver signal 825-2.

In this embodiment, at each point in time, the transmission medium 140 may see either a positive driving pulse, a negative driving pulse, or no voltage difference at its primary side, resulting in the three-level driver signal shown in the third graph 930. Particularly, the three-level driver signal shown in the third graph 930 essentially includes a positive driving pulse at each pulse beginning of the two-level input voltage signal 110, a negative driving pulse at each pulse end of the two-level input voltage signal 110, and a zero level everywhere else. In this way, it will now be apparent that the three-level driver signal may essentially include a three-level representation of the pulse information from the two-level input voltage signal 110 (though possibly with additional artifacts, like delay). Further, it will be appreciated that the pulse width of the three-level driver signal is at least partially related to the amount of delay introduced by the delay unit 810. As such, adjusting the amount of delay may allow the effective adjustment of pulse width.

The fourth graph 940 and the fifth graph 950 show the input and the output to the hysteresis comparator 850, respectively.

The input, shown in the fourth graph 940, may be the voltage induced across the secondary side of the pulse transformer 840 by the three-level driver signal, which may substantially mimic the three-level driver signal (e.g., where there is a 1-to-1 turns ratio in the pulse transformer). As shown in the fifth graph 950, when the input to the hysteresis comparator 850 exceeds a positive threshold value ("$V_{TH+}$"), the output of the hysteresis comparator 850 may transition to a logical HIGH. The output of the hysteresis comparator 850 may then remain at logical HIGH until the input to the hysteresis comparator 850 crosses a negative threshold value ("$V_{TH-}$"). At this point, the output of hysteresis comparator 850 may transition to a logical LOW.

The output of the hysteresis comparator 850 may be passed as the output voltage 160 of the communication system 800. It will be appreciated that, depending on the components, signals, and other characteristics of the communication system 800 and the application in which it is being used, the output voltage 160 (e.g., as shown in the fifth graph 950) may differ from the two-level input voltage signal 110 (e.g., as shown in the first graph 910). For example, there may be delay, noise, change in amplitude, etc. Still, it will now be appreciated that using providing the communication system 800 with the differentially driven pulse shaping unit (e.g., the first buffer unit 820-1, the second buffer unit 820-2, and the delay unit 810), may allow the output voltage 160 to substantially preserve the pulse information of the two-level input voltage signal 110.

It will be appreciated that other embodiments of pulse shaping units are possible according to the invention. Further, different embodiments may exhibit certain characteristics which may be desirable or undesirable in certain applications. For example, comparing the embodiment of the TTTL pulse shaping unit 600 of FIG. 6 to the embodiment of the differential pulse shaping unit 800 of FIG. 8 illustrates certain different characteristics between the two embodiments. One difference is that the TTTL pulse shaping unit 600 may operate using two source voltages (e.g., +Vs and −Vs), while the differential pulse shaping unit 800 may operate using only a single source voltage (e.g., +Vs). This may reduce the external component count when integrated into a monolithic IC. Another difference is that the pulse transformer used by the TTTL pulse shaping unit 600 may be replaced by a coaxial cable of similar characteristic impedance (e.g., 50 Ohms), while the pulse transformer used with the differential pulse shaping unit 800 may be replaced by a twisted wire pair of similar characteristic impedance.

Other embodiments, including embodiments of the TTTL pulse shaping unit 600 of FIG. 6 or the differential pulse shaping unit 800 of FIG. 8, may use a Faraday-shielded pulse transformer or a center-tap pulse transformer. For example, FIGS. 10A and 10B show exemplary communication systems using center-tapped pulse transformers, according to various embodiments of the invention. Each communication system 1000 includes a pulse shaping unit 130, a transmission medium 140, and a pulse recovery unit 150. The pulse shaping unit 130 includes a number of components configured to generate substantially short pulses at each rising and falling edge of a two-level input voltage signal 110. The transmission medium 140 includes a center-tapped pulse transformer, and the pulse recovery unit 150 includes a hysteresis comparator 1050 and a resistor 1052.

In the embodiments shown, the pulse shaping unit 130 includes two inverters 1002, a delay device 1004, two AND gates 1008, and two transistors 1012. The pulse shaping unit 130 generates four intermediate signals 1006. The first intermediate signal 1006-1 is substantially identical to the two-level input voltage signal 110. The second intermediate signal 1006-2 is substantially an inverted version of the two-level input voltage signal 110 (e.g., generated using a first inverter 1002-1). The third intermediate signal 1006-3 is substantially a delayed version of the two-level input voltage signal 110 (e.g., generated using delay device 1004). The fourth intermediate signal 1006-4 is substantially an inverted and delayed version of the two-level input voltage signal 110 (e.g., generated using the delay device 1004 followed by a second inverter 1002-2).

The second intermediate signal 1006-2 and the third intermediate signal 1006-3 are passed to a first AND gate 1008-1, which generates a first transistor driver signal 1010-1. The first transistor driver signal 1010-1 represents performance of a logical AND operation on the second intermediate signal 1006-2 and the third intermediate signal 1006-3, such that the first transistor driver signal 1010-1 is HIGH only when both the second intermediate signal 1006-2 and the third intermediate signal 1006-3 are HIGH. The first intermediate signal 1006-1 and the fourth intermediate signal 1006-4 are passed to a second AND gate 1008-2, which generates a second transistor driver signal 1010-2. The second transistor driver signal 1010-2 represents performance of a logical AND operation on the first intermediate signal 1006-1 and the fourth intermediate signal 1006-4.

The first transistor 1012-1 is an N-type transistor with its source tied to a ground level 120 and its drain tied to one side of the primary winding 1040-1 of the transmission medium 140. The gate of the first transistor 1012-1 is driven by the first transistor driver signal 1010-1. The second transistor 1012-2 is an N-typo transistor with its source tied to the ground level 120 and its drain tied to the other side of the primary winding 1040-1 of the transmission medium 140. The gate of the second transistor 1012-2 is driven by the second transistor driver signal 1010-2. The primary winding 1040-1 of the transmission medium 140 is configured so that an intermediate location on the winding (e.g., the center of the winding) is tapped and connected with a source voltage level 1020 (e.g., generated by a voltage source connected between the center-tap and the ground level 120).

It will be appreciated that the first transistor driver signal 1010-1 will show a positive pulse at each rising edge of the two-level input voltage signal 110, and the second transistor driver signal 1010-2 will show a positive pulse at each falling edge of the two-level input voltage signal 110. Further, it will be appreciated that the pulse width of the transistor driver signals 1010 will be at least partially determined by the magnitude of delay provided by the delay device 1004. In some embodiments, the magnitude of delay is chosen to be small so as to generate narrow pulses on the transistor driver signals 1010. Because each of the transistor driver signals 1010 drives one of the transistors 1012, a pulse will be communicated to one side of the primary winding 1040-1 at each rising edge of the two-level input voltage signal 110, and a pulse will be communicated to the other side of the primary winding 1040-1 at each falling edge of the two-level input voltage signal 110. As such, a three-level signal is effectively received by the secondary winding 1040-2 of the transmission medium 140. This three-level driver signal is then communicated across the resistor 1052 and to the hysteresis comparator 1050, which generates a two-level output signal 160, as described above with respect to other embodiments.

The embodiment of the communication system 1000-1 shown in FIG. 10A shows one side of the secondary winding 1040-2 connected with floating ground 180. The embodiment of the communication system 1000-2 shown in FIG. 10B shows the hysteresis comparator 1050 differentially driven, with the secondary winding 1040-2 center-tapped to floating ground 180. It will be appreciated that the hysteresis comparator 1050 may have substantial common-mode rejection functionality. The hysteresis comparator 1050 may manifest a high common-mode rejection ratio ("CMRR"), allowing the hysteresis comparator 1050 to reliably detect small-scale changes in the difference between its inputs while substantially rejecting the large-scale signal. In some applications, for example, the differential signal of interest is very small relative to high voltage offsets. Embodiments, like the communication system 1000-2 shown in FIG. 10B, may allow greater use of the common-mode rejection functionality of the hysteresis comparator 1050.

Figure 11:
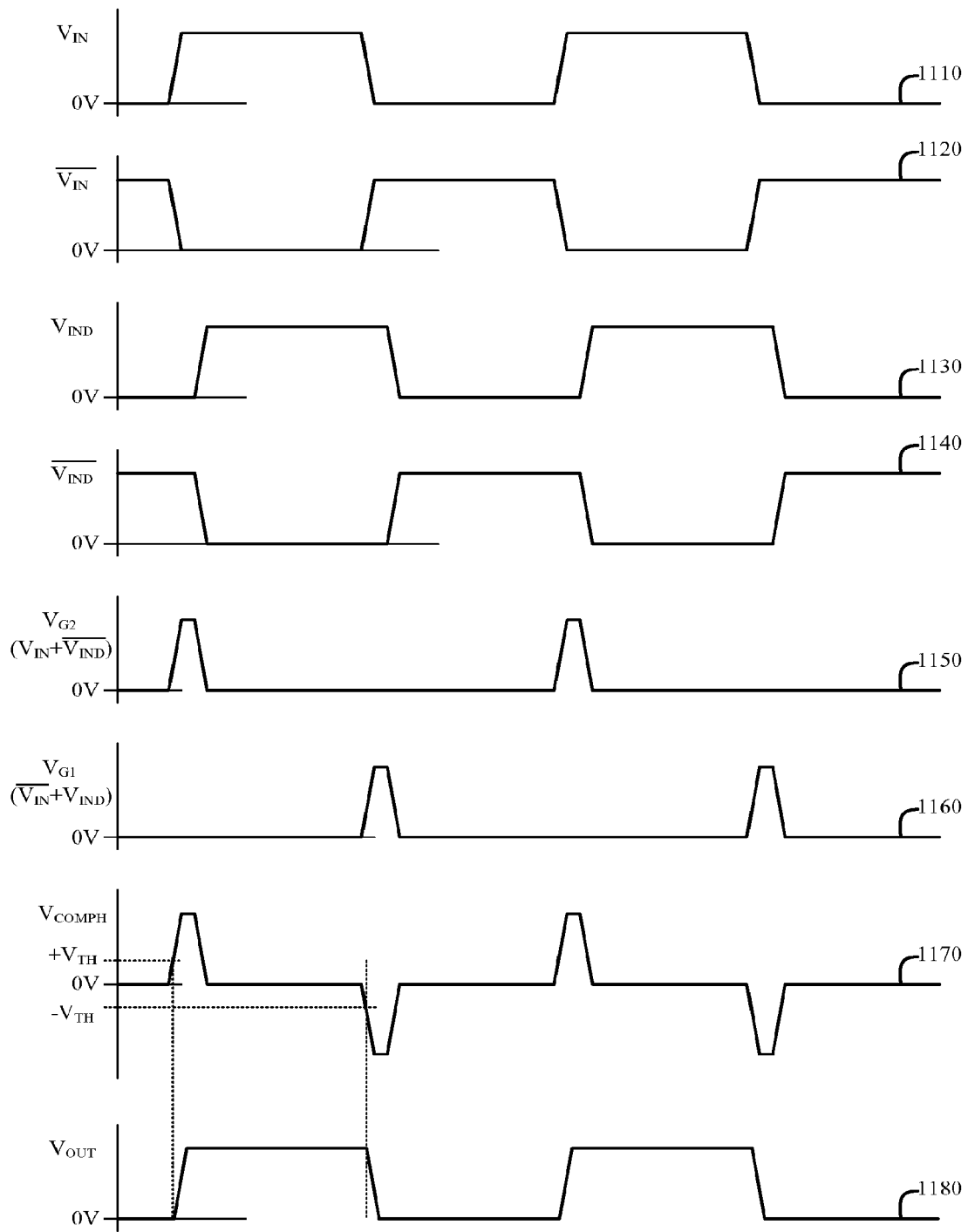
FIG. 11 shows graphs of illustrative signals read at various points in the communication systems of FIGS. 10A and 10B.

FIG. 11 shows graphs of illustrative signals read at various points in the communication systems 1000 of FIGS. 10A and 10B. The first graph 1110 shows two pulse cycles of the two-level input voltage signal 110, going from zero volts to a positive voltage level (e.g., logical HIGH). The first graph 1110 further indicates that the two-level input voltage signal 110 may be substantially equivalent to the first intermediate signal 1006-1. The second graph 1120 shows two pulse cycles of the second intermediate signal 1006-2, which may substantially be an inverted version of the first intermediate signal 1006-1. The third graph 1130 shows two pulse cycles of the third intermediate signal 1006-3, which may substantially be a delayed version of the first intermediate signal 1006-1. The fourth graph 1140 shows two pulse cycles of the fourth intermediate signal 1006-4, which may substantially be an inverted version of the third intermediate signal 1006-3 (e.g., an inverted and delayed version of the first intermediate signal 1006-1).

The fifth graph 1150 shows two pulse cycles of the second transistor driver signal 1010-2. The fifth graph 1150 further indicates that the second transistor driver signal 1010-2 substantially represents performance of a logical AND operation on the first intermediate signal 1006-1 and the fourth intermediate signal 1006-4. The sixth graph 1160 shows two pulse cycles of the first transistor driver signal 1010-1. The sixth graph 1160 further indicates that the first transistor driver signal 1010-1 substantially represents performance of a logical AND operation on the second intermediate signal 1006-2 and the third intermediate signal 1006-3. As illustrated in FIGS. 10A and 10B, each transistor 1012 is configured to pull one side of the primary winding 1040-1 of the transmission medium 140 to ground, when its gate voltage is HIGH. Further, the first transistor driver signal 1010-1 is applied to one side of the primary winding 1040-1, and the second transistor driver signal 1010-2 is applied to the other side of the primary winding 1040-1, and the primary winding 1040-1 is center-tapped to the source voltage level 1020. As such, the transmission medium effectively communicates a signal to its secondary winding 1040-2 that looks like the signal shown in the seventh graph 1170. Notably, the seventh graph 1170 shows that, although two-level signals are applied to the primary winding 1040-1 of the transmission medium 140, a three-level signal is generated as a result of the center-tapped configuration.

The three-level driver signal shown in the seventh graph 1170 essentially includes a narrow positive pulse at each rising edge of the two-level input voltage signal 110, a narrow negative pulse at each falling edge of the two-level input voltage signal 110, and a zero level everywhere else. In this way, it will now be apparent that the three-level driver signal may essentially include a three-level representation of the pulse information from the two-level input voltage signal 110 (though possibly with additional artifacts, like delay). Further, it will be appreciated that the pulse width of the three-level driver signal is at least partially related to the amount of delay introduced by the delay device 1004. As such, adjusting the amount of delay may allow the effective adjustment of pulse width.

The signal shown in the seventh graph 1170 is communicated to the hysteresis comparator 1050 (e.g., differentially, as in FIG. 10B or non differentially, as in FIG. 10A). The output of the hysteresis comparator 1050 may look substantially like the signal shown in the eighth graph 1180. As shown in the eighth graph 1180, when the input to the hysteresis comparator 1050 exceeds a positive threshold value ("$V_{TH+}$"), the output of the hysteresis comparator 1050 may transition to a logical HIGH. The output of the hysteresis comparator 1050 may then remain at logical HIGH until the input to the hysteresis comparator 1050 crosses a negative threshold value ("$V_{TH-}$"). At this point, the output of hysteresis comparator 1050 may transition to a logical LOW.

The output of the hysteresis comparator 1050 may be passed as the output voltage 160 of the communication system 1000. It will be appreciated that, depending on the components, signals, and other characteristics of the communication system 1000 and the application in which it is being used, the output voltage 160 (e.g., as shown in the eighth graph 1180) may differ from the two-level input voltage signal 110 (e.g., as shown in the first graph 1110). For example, there may be delay, noise, change in amplitude, etc. Still, it will now be appreciated that using providing the communication system 1000 with the center-tapped transmission medium 140 may allow the output voltage 160 to substantially preserve the pulse information of the two-level input voltage signal 110.

It will be further appreciated that the specific implementations described herein are intended merely to provide a portion of the many possible implementations of the embodiments of the invention, and should not be construed as limiting the invention in any way. For example, units and components of the devices and systems may, individually or collectively, be implemented with one or more circuit components, Application Specific Integrated Circuits (ASICs), or other elements adapted to perform some or all of the applicable functions. Alternatively, the functions may be performed by one or more computational systems or processing units, and/or on one or more integrated circuits. In other embodiments, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors.

Figure 12:
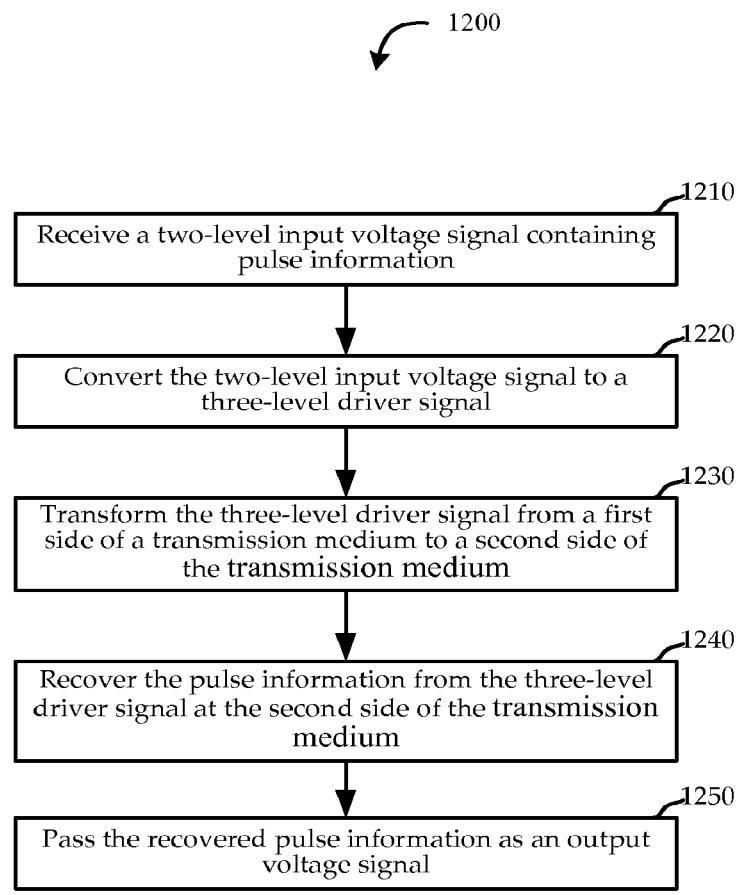
FIG. 12 shows a flow diagram of exemplary methods for providing pulse signal information using a communication system, according to various embodiments of the invention.

FIG. 12 shows a flow diagram of exemplary methods for providing pulse signal information using a communication system, according to various embodiments of the invention. The method 1200 begins at block 1210 by receiving a two-level input voltage signal that contains pulse information. In some embodiments, the input voltage signal is a periodic signal with a constant duty cycle (e.g., a square wave). In other embodiments, the input voltage is a PWM signal having pulses with continually changing duty cycles. The pulse information may include locations of the rising edge (e.g., beginning) and falling edge (e.g., end) of each pulse received as part of the input signal.

The pulse information from the two-level input voltage signal received at block 1210 may be converted to a three-level driver signal at block 1220. In some embodiments, the three-level driver signal is generated asynchronously, such that it is independent of the period of the input signal received at block 1210. For example, where the input signal is a PWM signal, it may be desirable to generate the three-level driver signal at block 1220 as a function of the rising and falling edges of each pulse, so as to retain information for use in recreating output pulses of substantially the same width as the input pulses. For example, to certain embodiments, the three-level driver signal includes a positive pulse at each rising edge of the input signal, a negative pulse at each falling edge of the input signal, and a substantially zero level otherwise. Further, some embodiments generate the three-level driver signal at block 1220 using substantially narrow pulses. As explained above, this may allow compatibility with a greater range of input PWM pulse widths.

At block 1230, the three-level driver signal may be passed across a transmission medium (e.g., a pulse transformer). In some embodiment, the three-level driver signal is applied to a primary side of the transmission medium (e.g., as shown by the driver signal 535 generated by the circuit arrangement of FIG. 5). In other embodiments, a two-level driver signal is applied to the primary side of the transmission medium, and the transmission medium is configured to receive the signal as a three-level signal at its secondary side (e.g., as with the center-tapped configuration shown in FIGS. 10A and 10B).

The original pulse information may then be recovered from the three-level driver signal at block 1240. In some embodiments, the three-level driver signal is communicated to a hysteresis comparator, which transitions its output to a logical HIGH when its input crosses a positive threshold value, and effectively latches the output at the HIGH level until its input crosses below a negative threshold value. In other embodiments, other switching and/or latching devices are used for recover the pulse information. For example, various types of latches, flip flops, and other devices may be used, according to various embodiments of the invention. The pulse information recovered at block 1240 may be output at block 1250 as an output voltage signal.

Exemplary Bidirectional Topology Embodiments

The embodiments described above with respect to FIGS. 1-12 illustrate one-directional communication across a transmission medium, like a pulse transformer. It will be appreciated, however, that many applications call for bidirectional communications. In the context of bidirectional communications, it may often be desirable to reliably and simultaneously communicate data over the same transmission medium, which may include handling potential issues like data collisions in the transmission medium. Among other things, systems, devices, and methods are described for bidirectional communication systems that handle collisions without using complex handshaking routines.

Typically, bidirectional communication systems may be designed to operate either as half duplex or full duplex systems. Half duplex systems may only allow one side of a communication system to transmit at a time. Full duplex systems may allow both sides of the communication system to transmit simultaneously.

A difficulty with implementing full duplex systems may be the avoidance of collisions where multiple transmissions occur simultaneously. Many full duplex systems avoid collisions by providing collision-free channels though multiplexing or multiple access techniques. For example, some systems may divide multiple transmissions among multiple separate frequencies (e.g., frequency division duplex, or "FDD"), multiple physical channels, multiple time divisions (e.g., time division duplex, or "TDD"), etc. While collision avoidance may ensure collision-free transmissions, the implementation may use more bandwidth, more physical wires or buses, etc. Alternately, other full duplex systems handle, rather than avoid, collisions. Collision handling may be performed though complex handshaking (e.g., collision detection, echo cancellation, etc.) routines, implemented in hardware and/or software. While these techniques may preserve bandwidth and reduce the number of physical channels, they may also be difficult and/or expensive to implement, and may produce undesirable artifacts (e.g., undesirable delays, echoes, muting, etc.).

The term "bidirectional" is used herein to describe the communication (i.e., sending and receiving) of data between multiple components (e.g., two sides of a communication system, two systems, two parties, etc.). It will be appreciated that a bidirectional system may include many components, channels, etc., all of which may communicate simultaneously. As such, while embodiments are described herein with only two communicating components for convenience, those of skill in the art will appreciate that the invention may be expanded for use with more than two communicating components. Further, while the embodiments are described with reference to pulse transformers, it will be appreciated that any compatible transmission medium may be used according to the invention. For example, some communication systems may be implemented to communicate signals via cables, wires, buses, waveguides, water, or many other types of transmission media.

Figure 13:
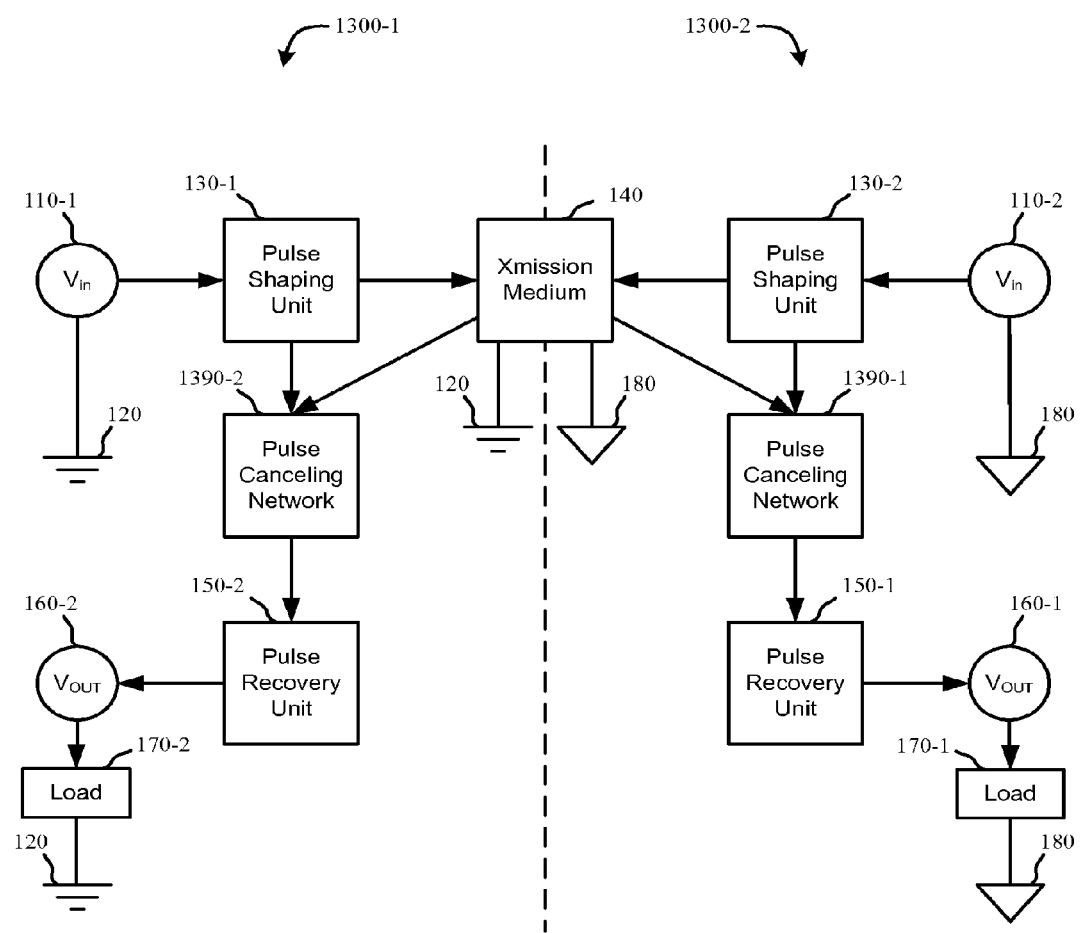
FIG. 13 shows a simplified block diagram of an exemplary communication system using a transmission medium, according to various embodiments of the invention.

FIG. 13 shows a simplified block diagram of an exemplary communication system using a transmission medium. Each side of the communication system 1300 includes a pulse shaping unit 130, a pulse canceling network 1390, and a pulse recovery unit 150. One side of the communication system 1300-1 is connected to earth ground 120, and the other side of the communication system 1300-2 is connected to floating ground 180 (e.g., chassis ground). The two sides of the communication system 1300 are in communication via a transmission medium 140.

In an illustrative bidirectional communication, a first input voltage source 110-1 (on the first side of the communication system 1300-1 and connected to earth ground 120) may provide a first input pulse signal to a first pulse shaping unit 130-1. The first pulse shaping unit 130-1 may convert the pulse information from the first input pulse signal into a first driver signal. It will be appreciated that many types of pulse shaping units 130 are possible according to the invention. The first driver signal may be passed across the transmission medium 140 (e.g., a pulse transformer) to the second side of the communication system 1300-2.

Typically, the transmission medium 140 may be used to transmit pulse information from one of the input voltage sources 110 to be used across one of the loads 170. Of course, the transmission medium 140 may provide additional functionality. In some embodiments, a pulse transformer is used as the transmission medium 140 to provide an isolation boundary between the primary side of the circuit connected to earth ground 120 and the secondary side of the circuit connected to floating ground 180. In other embodiments, the transmission medium 140 provides impedance matching between each of the input voltage sources 110 and its respective load 170. In still other embodiments, the transmission medium 140 adjusts the signal amplitude, e.g., by stepping up or stepping down the voltage of the signal.

In some embodiments (e.g., where the transmission medium 140 is a pulse transformer), the communication system 1300 is designed to avoid saturation. For example, operation of the communication system 1300 may create a magnetizing force in a pulse transformer, which may generate a magnetic flux density in its core. As the flux density continues to increase, it may at some point exceed the flux capacity of the core, thereby saturating the core. Once the core has become saturated, the pulse transformer may no longer operate to communicate pulse information. Thus, it may be desirable (or even critical) to avoid saturation in order to effectively communicate pulse information in certain embodiments.

One way to avoid saturation may be to use the first pulse shaping unit 130-1 to limit the width of pulses coming from the first input voltage source 110-1, as described above. Limiting the pulse width may give the transmission medium 140 time to "reset" between pulses. For example, if a pulse transformer is used, allowing the core sufficient time to reset may keep the flux density in its core from exceeding the flux capacity of the core, thereby avoiding core saturation. As such, the first pulse shaping unit 130-1 may receive the pulse information from the first input voltage source 110-1, and communicate the pulse information to the transmission medium 140 as a series of narrow pulses.

At substantially the same time, a second input voltage source 110-2 (on the second side of the communication system 1300-2 and connected to floating ground 180) may provide a second input pulse signal to a second pulse shaping unit 130-2. The second pulse shaping unit 130-2 may convert the pulse information from the second input pulse signal into a second driver signal, in the same or a different way from the first pulse shaping unit 130-1. The second driver signal may be passed across the transmission medium 140 (e.g., the pulse transformer) to the first side of the communication system 1300-1.

Because both driver signals are being transmitted simultaneously over the same transmission medium 140, they may interfere with one another (e.g., the signals may add or collide). As such, the signal received at each side of the transmission medium 140 may include pulse information from both input voltage sources 110-1 and 110-2. In some embodiments, on each side of the communication system 1300, a pulse canceling network 1390 is provided. The pulse canceling network 1390 may be operable to cancel undesirable pulse information from the received driver signal, while preserving the desirable pulse information.

For example, a first input signal is sent over the transmission medium 140 from the first side of the communication system 1300-1. When received at the second side of the communication system 1300-2, the signal may include both the intended pulse information from the first input signal and information from a second input signal (e.g., being sent from the second side of the communication system 1300-2). The first pulse canceling network 1390-1 (on the second side of the communication system 1300-2) removes pulse information from the second input signal, while preserving pulse information coming from the first input signal, thereby allowing the second side of the communication system 1300-2 to effectively receive and use only the desired pulse information from the first input signal.

The remaining pulse information preserved by each pulse canceling network 1390-1 or 1390-2 may then be passed to a respective pulse recovery unit 150-1 or 150-2. Each pulse recovery unit 150 may be used to recover the original (unshaped) pulse information from its respective input voltage source 110 to generate an output voltage signal 160. For example, the first pulse recovery unit 150-1 may be used to make the first output voltage signal 160-1 substantially match the signal from the first input voltage source 110-1. The first output voltage signal 160-1 may then be used, e.g., to control the first load 170-1. At substantially the same time, the second pulse recovery unit 150-2 may be used to make the second output voltage signal 160-2 substantially match the signal from the second input voltage source 110-2. The second output voltage signal 160-2 may then be used, e.g., to control the second load 170-2.

Of course, in certain embodiments, the output voltage signal 160 may not match the signal from the input voltage source 110. For example, the pulse shaping unit 130, transmission network 140, pulse canceling network 1390, and/or pulse recovery unit 150 may generate undesirable artifacts (e.g., noise, delay, etc.) or desirable artifacts (e.g., an amplitude change) between the two signals.

Figure 14:
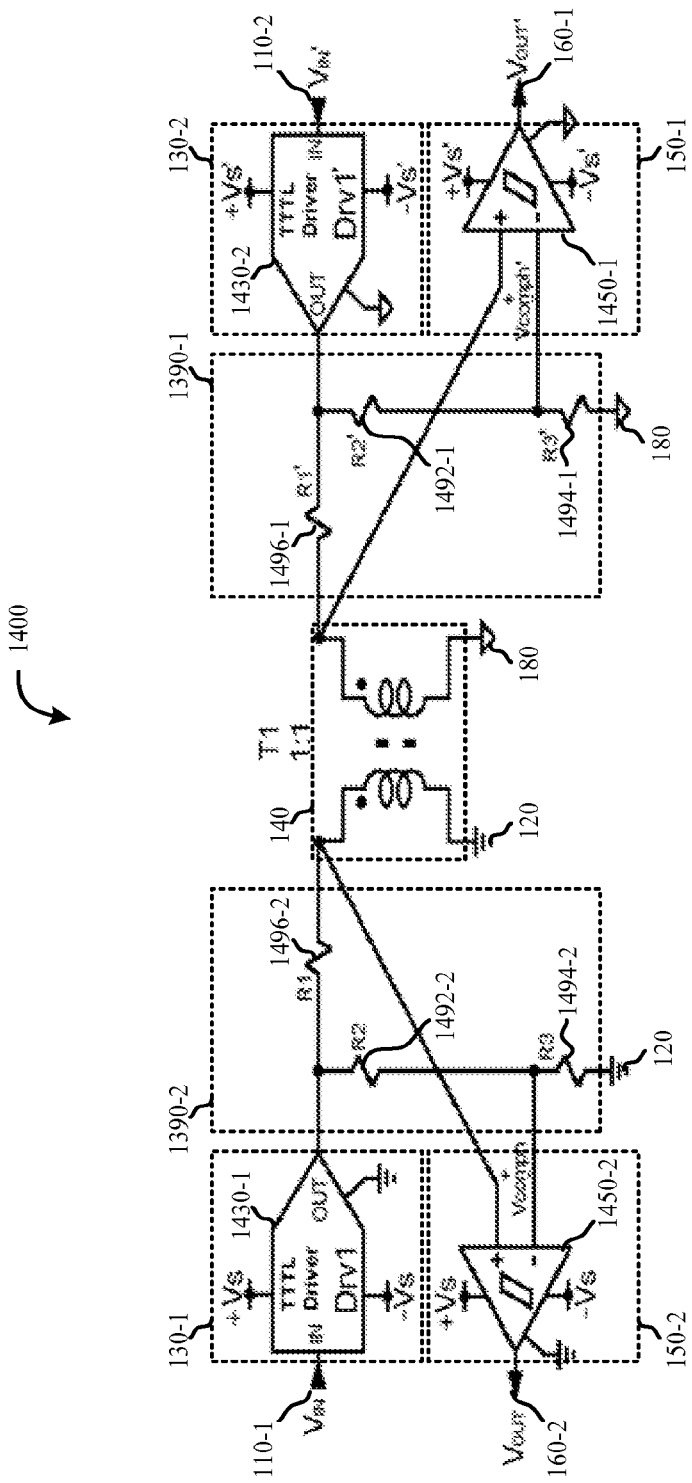
FIG. 14 shows a simplified block diagram of an exemplary communication system using a TTTL pulse shaping unit and a pulse transformer, according to various embodiments of the invention.

FIG. 14 shows a simplified block diagram of an exemplary communication system using a two-to-three level ("TTTL") pulse shaping unit and a pulse transformer. Each side of the communication system 1400 includes a pulse shaping unit 130, a pulse canceling network 1390, and a pulse recovery unit 150. The pulse shaping unit 130 includes a TTTL driver 1430, the pulse canceling network 1390 includes a resistor network (including resistors 1492, 1494, and 1496), and the pulse recovery unit 150 includes a hysteresis comparator 1450. One side of the communication system 1400-1 is connected to earth ground 120, and the other side of the communication system 1400-2 is connected to floating ground 180 (e.g., chassis ground). The two sides of the communication system 1400 are in communication via a transmission medium 140 (e.g., a pulse transformer), with its primary side connected to earth ground 120 on the first side of the communication system 1400-1 and its secondary side connected to floating ground 180 on the second side of the communication system 1400-2. Embodiments of the TTTL driver unit 1430 are described more fully above (e.g., with respect to FIGS. 5-7).

In some embodiments, the TTTL driver units 1430 implement functionality similar to the TTTL driver unit 600 described in FIG. 6, and the hysteresis comparators 1450 implement functionality similar to the hysteresis comparator 300 described in FIG. 3. Embodiments of the communication system 1400 receive a first input voltage signal 110-1, and convert the first input voltage signal 110-1 (e.g., using the first TTTL driver unit 1430-1) to a first three-level driver signal. The first three-level driver signal is communicated to a first side of the transmission medium 140 (e.g., the pulse transformer), and received at a second side of the transmission medium 140. At substantially the same time, the communication system 1400 receive a second input voltage signal 110-2, and convert the second input voltage signal 110-2 (e.g., using the second TTTL driver unit 1430-2) to a second three-level driver signal. The second three-level driver signal is communicated to the second side of the transmission medium 140, and received at the first side of the transmission medium 140.

Because the second input voltage signal 110-2 is being communicated to the second side of the transmission medium 140 while the first input voltage signal 110-1 is being received at the second side of the transmission medium 140, the signal at the second side of the transmission medium 140 may include pulse information from both the first input voltage signal 110-1 and the second input voltage signal 110-2. The first resistor network (including a first resistor 1492-1, a second resistor 1494-1, and a third resistor 1496-1), effectively preserves the pulse information from the first input voltage signal 110-1, while cancelling out the pulse information from the second input voltage signal 110-2. As such, the signal seen by the first hysteresis comparator 1450-1 substantially includes only the pulse information from the first input voltage signal 110-1. As described above, the first hysteresis comparator 1450-1 converts the received three-level signal into a first two-level output signal 160-1 that substantially recreates the pulse information from the first input voltage signal 110-1 at the second side of the communication system 1400.

Similarly, the first input voltage signal 110-1 is being communicated to the first side of the transmission medium 140 while the second input voltage signal 110-2 is being received at the first side of the transmission medium 140, so that the signal at the first side of the transmission medium 140 may include pulse information from both the first input voltage signal 110-1 and the second input voltage signal 110-2. The second resistor network (including a fourth resistor 1492-2, a fifth resistor 1494-2, and a sixth resistor 1496-3), effectively preserves the pulse information from the second input voltage signal 110-2, while cancelling out the pulse information from the first input voltage signal 110-1. As such, the signal seen by the second hysteresis comparator 1450-2 substantially includes only the pulse information from the second input voltage signal 110-2. As described above, the second hysteresis comparator 1450-2 converts the received three-level signal into a second two-level output signal 160-2 that substantially recreates the pulse information from the second input voltage signal 110-2 at the first side of the communication system 1400.

Figure 15:
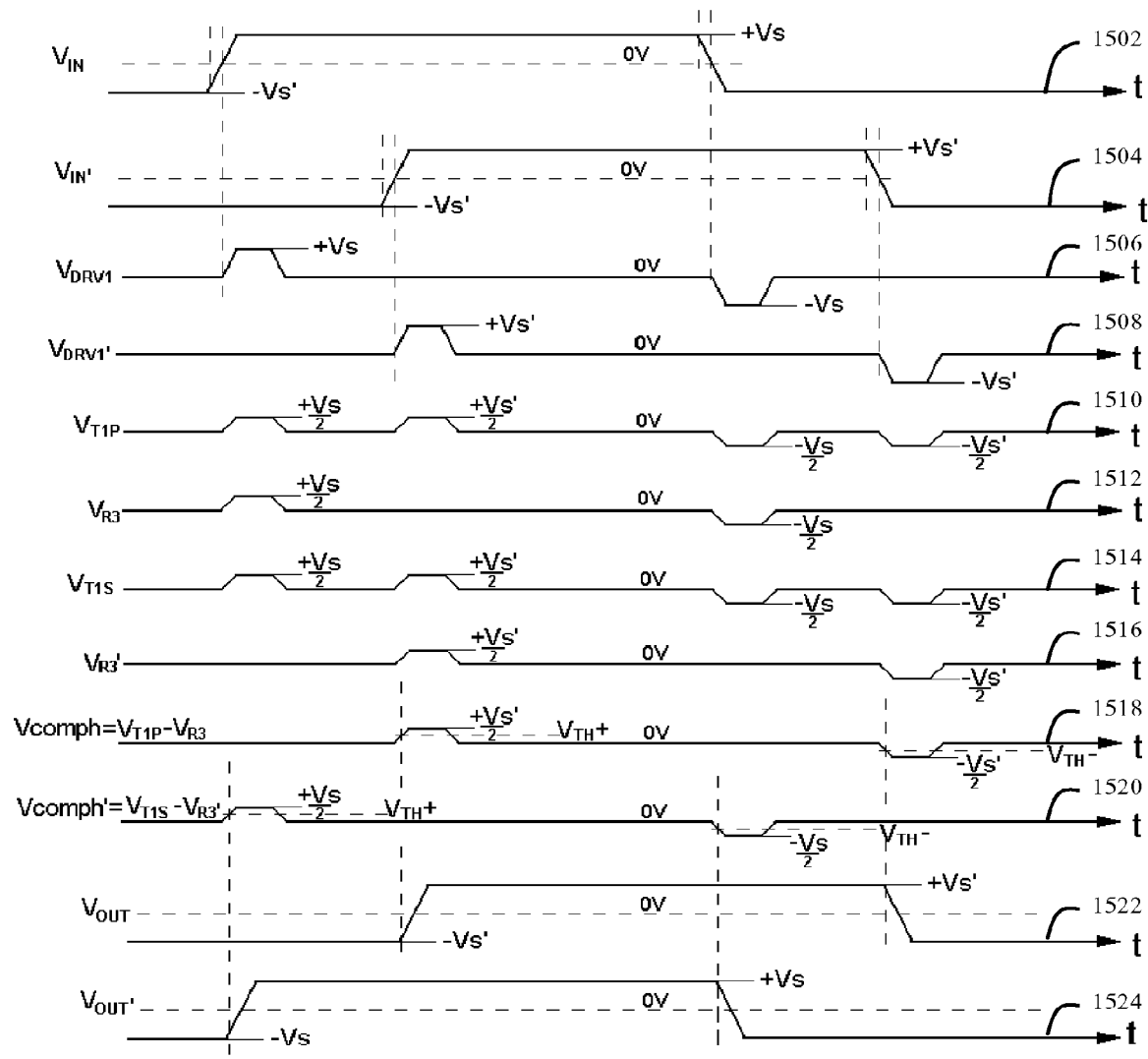
FIG. 15 shows graphs of illustrative signals read at various points in a communication system, like the communication system of FIG. 14.

FIG. 15 shows graphs of illustrative signals read at various points in a communication system, like the communication system 1400 of FIG. 14. The first graph 1502 shows one pulse of a first input pulse signal coming from the first input voltage source 110-1. In some embodiments, the first input pulse signal goes from zero volts to some logical high voltage level. In other embodiments, as shown in the first graph 1502, the first input pulse signal goes from a negative source voltage ("$-V_S$") to a positive source voltage ("$+V_S$"). The second graph 1504 shows one pulse of a second input pulse signal coming from the second input voltage source 110-2. It is worth noting that the second input voltage signal is shown as similar to the first input pulse signal, with different pulse information (e.g., pulses occurring at different times).

The TTTL driver 1430 may convert each input pulse signal into a three-level driver signal. The third graph 1506 and the fourth graph 1508 show the first three-level driver signal converted from the first input pulse signal by the first TTTL driver 1430-1 and the second three-level driver signal converted from the second input pulse signal by the second TTTL driver 1430-2, respectively. In some embodiments, the three-level driver signal may essentially include a relatively short positive driving pulse at the start of each input pulse in the shifted input voltage signal (e.g., where the shifted input voltage signal crosses zero volts in the positive direction), and a relatively short negative driving pulse at the end of each input pulse in the shifted input voltage signal (e.g., where the shifted input voltage signal crosses zero volts in the negative direction). For the time between each positive and negative pulse, the three-level driver signal remains at zero volts, thereby creating three distinct levels (e.g., the three-level driver signal may be at either $-V_S$, $+V_S$, or 0V, at any point in time).

The third and fourth graphs 1506 and 1508 show that the output of the TTTL drivers 1430 (i.e., the three-level driver signals) may tend to rest at zero volts for a relatively large percentage of each input pulse cycle, a time period that may be much greater than the time period where the three-level driver signal is at either $+V_S$ or $-V_S$. In this way, it may be possible to ensure that the transmission medium 140 (e.g., the pulse transformer) does not saturate. In some embodiments, the pulse width of the three-level driver signal is designed to be as short as possible (e.g., as short as practical for the transmission medium 140 being used). In certain embodiments, shortening the pulse width of the three-level driver signal helps maximize the bandwidth of the communication system 1400.

Each three-level driver signal may be passed across the transmission medium 140 to the opposite side of the communication system 1400. Because of the shared transmission medium 140, the signals received at each side of the communication system may include half-amplitude pulse information from both input voltage sources 110-1 and 110-2. The received signals (i.e., the voltage across each side of the transmission medium 140) are shown in the fifth and seventh graphs 1510 and 1514.

Each received signal is then passed to a pulse canceling network 1390, prior to being received by the hysteresis comparator 1450. The function of the hysteresis comparator 1450 may essentially be to compare the voltages at its two inputs. When its positive input voltage exceeds its negative input voltage, the hysteresis comparator 1450 may output a logical HIGH voltage; and when its negative input voltage exceeds its positive input voltage, the hysteresis comparator 1450 may output a logical LOW voltage. In the embodiment shown in FIG. 14, the positive input of each hysteresis comparator 1450 is driven by each received signal (i.e., the voltage across the respective side of the transmission medium 140), and the negative input of each hysteresis comparator 1450 is driven by the voltage across the second resistor 1494. Using a voltage divider configuration of the first resistor 1492 and the second resistor 1494 (e.g., with the first resistor 1492 and the second resistor 1494 being of equal value) may cause the voltage across the second resistor 1494 to essentially be a half-amplitude version of the input pulse signal coming from the input voltage source 110 on the same side of the communication system 1400 as the hysteresis comparator 1450.

For example, it may be desirable to send a signal ("Signal A") from the first input voltage source 110-1 (on the first side of the communication system 1400) as a first output voltage 160-1 across a first load (on the second side of the communication system 1400), while the second input voltage source 110-2 (on the second side of the communication system 1400) is transmitting a different signal ("Signal B"). However, the signal received at the terminals of the transmission medium 140 on the second side of the communication system 1400 may include pulse information from both Signal A and Signal B (e.g., as shown in the seventh graph 1514). As such, it may be desirable to remove the pulse information generated by Signal B from the received signal on the second side of the communication system 1400, in order to only pass Signal A to the first load (i.e., to prevent Signal B from interfering with the signal intended for the first load). The received signal is passed to the first pulse canceling network 1390-1, including the two resistors 1492-1 and 1494-1, at the input to the first hysteresis comparator 1450-1. The positive input of the first hysteresis comparator 1450-1 is driven by the received signal (i.e., which includes half-amplitude information from both Signal A and Signal B, as shown in the seventh graph 1514), and the negative input of the first hysteresis comparator 1450-1 is driven by the voltage across the second resistor 1494-1. The voltage across the second resistor 1494-1 is a half-amplitude version of Signal B (e.g., as shown in the eighth graph 1516). The differentially driven hysteresis comparator 1450 sees the difference between its terminals, which may effectively be a half-amplitude version of Signal A (e.g., the signal seen at the second side of the transmission medium 140 less the signal across the second resistor 1494-1, as shown in the tenth graph 1520). The operation of the communication system 1400 may be similar or identical in the other direction, as shown in the fifth, sixth, and ninth graphs 1510, 1512, and 1518. It will now be appreciated that the differential driving configuration of the hysteresis comparator 1450 may preserve desired pulse information while canceling undesirable pulse information.

An examination of the third and fourth graphs 1506 and 1508 reveals certain potential artifacts of the three-level driver signals. For example, noise (e.g., dV/dt noise) may arise from certain aspects of the circuit components, topologies, manufacturing processes, etc., as described in more detail above. In many applications, it may be desirable to ignore, or otherwise handle, the dV/dt noise, and other artifacts of the system (including, e.g., electromagnetic interference). For example, it may be desirable or even necessary to ensure that noise is not misinterpreted as pulses by the system. Otherwise, the output voltages 160 may not accurately represent the pulse information from the input voltage sources 110. As such, some embodiments of the invention, like the one shown in FIG. 14, use hysteresis comparators 1450 to help recover the pulse information from the input voltage signal 110. Embodiments of hysteresis comparators 1450 are described in more detail above (e.g., with respect to FIGS. 3 and 4).

Returning to FIG. 15, the ninth, tenth, eleventh, and twelfth graphs 1518, 1520, 1522, and 1524 show the input and the output of the two hysteresis comparators 1450-1 and 1450-2. Of course, other graphs may result from types of pulse recovery units 150, other than hysteresis comparators 1450. As shown in the ninth graph 1518, when the differential input (i.e., the positive input voltage level minus the negative input voltage level) to each hysteresis comparator 1450 exceeds a positive threshold value ("$V_{TH+}$"), the output of the hysteresis comparator 1450 may transition to a logical HIGH. The output of the hysteresis comparator 1450 may then remain at logical HIGH until the differential input to the hysteresis comparator 1450 crosses a negative threshold value ("$V_{TH-}$"). At this point, the output of the hysteresis comparator 1450 may transition to a logical LOW.

In this way, the hysteresis comparator 1450 may be able to substantially recover the desired initial input pulse signal for use across its respective load. For example, the first hysteresis comparator 1450-1 may be able to recover the first input pulse signal coming from the first input voltage source 110-1 to output as the first output voltage 160-1 for use across the first load. The recovered pulse signals are shown in the eleventh and twelfth graphs 1522 and 1524. It is worth noting that, depending on the components, signals, and other characteristics of the communication system 1400 and the application in which it is being used, the output voltages 160 may differ from the input pulse signals coming from the input voltage sources 110. For example, there may be delay, noise, change in amplitude, etc. Still, the recovered pulse signals in the eleventh and twelfth graphs 1522 and 1524 substantially preserve the information from the input pulse signals in the first and second graphs 1502 and 1504, respectively.

Some of the embodiments described above used a TTTL driver unit to generate a three-level driver signal for driving a transmission medium in a communication system. For example, the embodiment of the communication system 1400 shown in FIG. 14 uses the TTTL driver units 1430 to generate three-level driver signals for driving the transmission medium 140. Embodiments, including those using TTTL driver units, may be configured with one side of the primary winding of the pulse transformer tied to earth ground and one side of the secondary winding of the pulse transformer tied to floating ground. Alternatively, other embodiments of pulse shaping units differentially drive the pulse transformer (i.e., neither side of either winding is tied to ground) to effectively generate the three-level driver signal.

Figure 16:
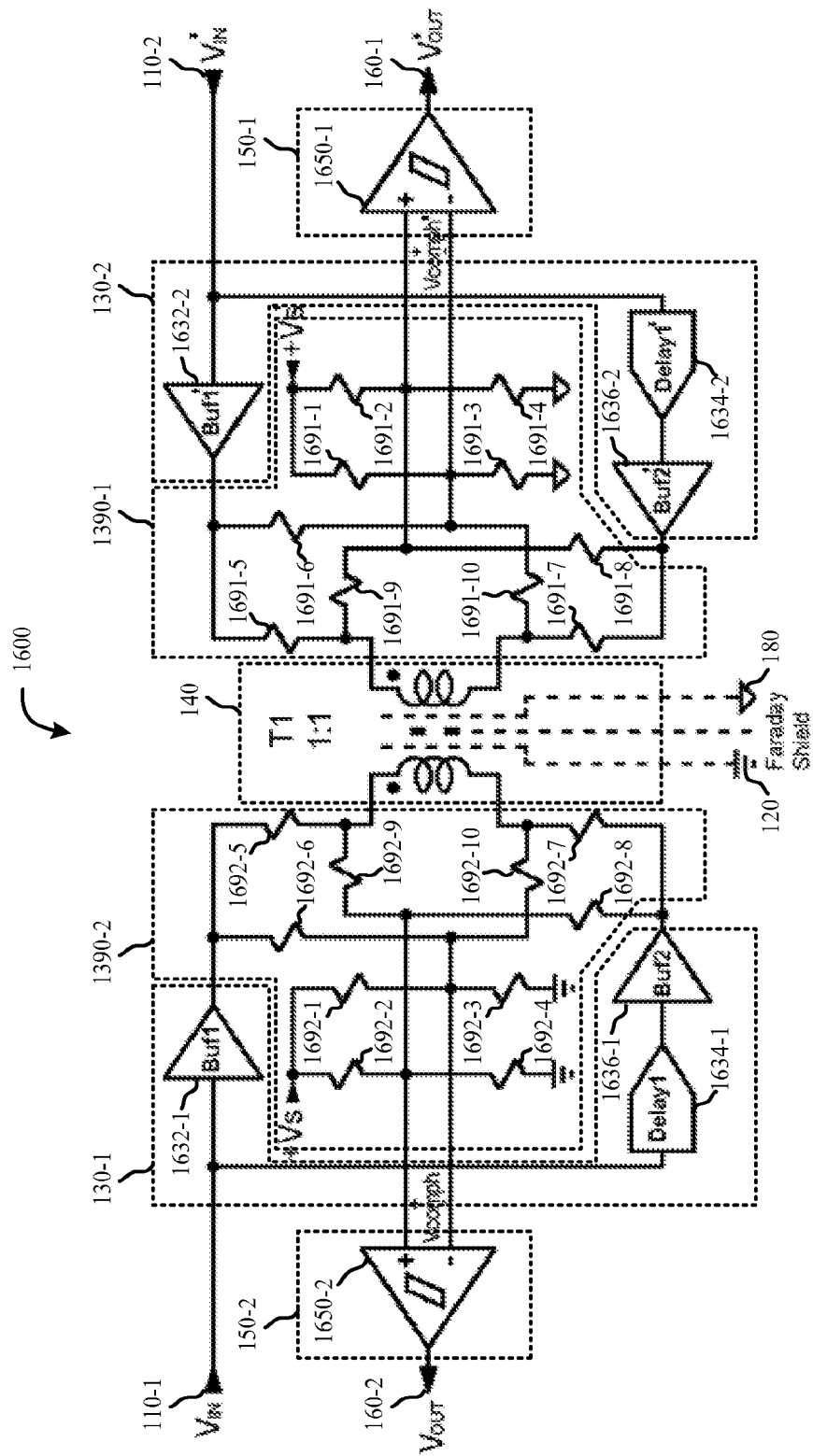
FIG. 16 shows a schematic of an exemplary communication system using a differentially driven pulse transformer, according to various embodiments of the invention.

FIG. 16 shows a schematic of an exemplary communication system using a differentially driven pulse transformer, according to various embodiments of the invention. Each side of the communication system 1400 includes a pulse shaping unit 130, a pulse canceling network 1390, and a pulse recovery unit 150, in communication with a transmission medium 140. Each pulse shaping unit 130 includes a first buffer unit 1632, and a second buffer unit 1636 driven by a delay unit 1634. Each pulse canceling network 1390 includes a resistor network (e.g., including ten resistors, as shown), and each pulse recovery unit 150 includes a hysteresis comparator 1650.

Each first buffer unit 1632 is operable to receive an input pulse signal from its respective input voltage source 110, buffer the input pulse signal, and generate a first buffered driver signal. Each second buffer unit 1636 is operable to receive a delayed input pulse signal (i.e., the input pulse signal with an added delay created by its respective delay unit 1634), buffer the delayed input pulse signal, and generate a second buffered driver signal. The first buffered driver signal and the second buffered driver signal are used to differentially drive the transmission medium 140, effectively generating a three-level driver signal. The three-level driver signal is passed across the transmission medium 140 to the pulse canceling network 1390, where appropriate pulse information is allowed to pass and undesired pulse information is removed from the signal. The remaining pulse information passes to the hysteresis comparator 1650, which substantially recovers the appropriate input pulse signal and generates an output voltage 160. The output voltage 160 may be used across a load. It will be appreciated that, in some embodiments, the black-box functionality of the communication system 1600 (i.e., the outputs of the system as a function of its inputs) may be substantially identical to the black-box functionality of the communication system 1400 of FIG. 14.

Figure 17:
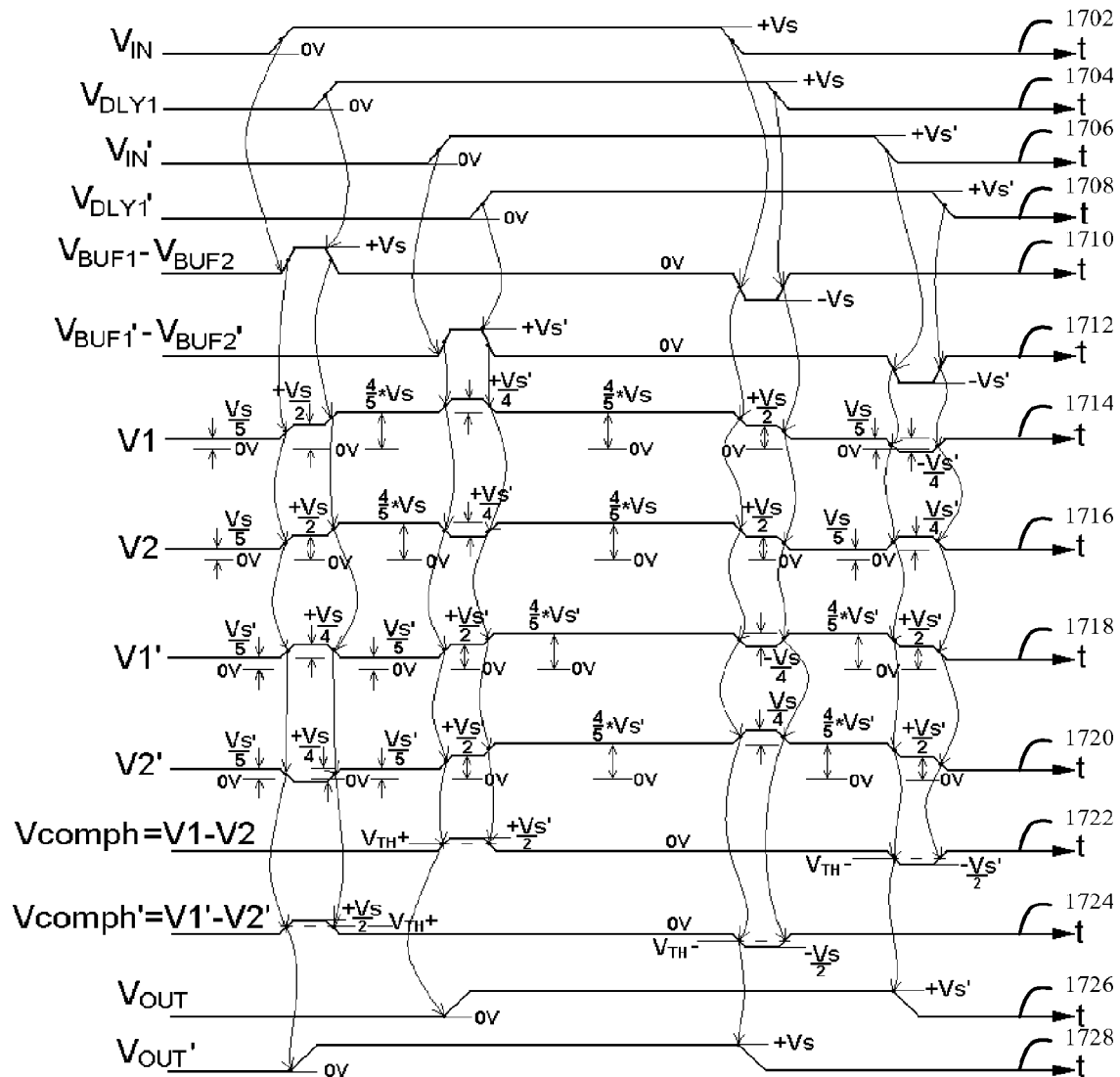
FIG. 17 shows graphs of illustrative signals read at various points in the communication system of FIG. 16.

FIG. 17 shows graphs of illustrative signals read at various points in the communication system 1600 of FIG. 16. The first graph 1702 shows one pulse cycle of the input pulse signal at the input to the primary-side first buffer unit 1632-1, going from zero volts to a positive source voltage ("+$V_S$"). The input pulse signal at the input to the primary-side first buffer unit 1632-1 may be substantially equivalent to the signal at the output of the primary-side first buffer unit 1632-1. The second graph 1704 shows one pulse cycle of the delayed input pulse signal at the input to the primary-side second buffer unit 1636-1, going from zero volts to a positive source voltage ("+$V_S$"). The delayed input pulse signal at the input to the primary-side second buffer unit 1636-1 may be substantially equivalent to the signal at the output of the primary-side second buffer unit 1636-1. The third graph 1706 and the fourth graph 1708 show input pulse signal associated with the secondary-side first buffer unit 1632-2 and the delayed input pulse signal associated with the secondary-side second buffer unit 1636-2, respectively.

The fifth graph 1710 shows the differential signal resultant at the primary side of the transmission medium 140 from the differential use of the two buffered driver signals. Because the buffered driver signal drives one side of the primary winding of the pulse transformer transmission medium 140 and the delayed buffered driver signal drives the other side of the primary winding of the transmission medium 140, the transmission medium 140 may effectively see a voltage across its primary side that is substantially equivalent to the difference between the two buffered driver signals. As such, the transmission medium 140 may only operate as a transformer when the difference between the voltages of the two buffered driver signals is not equal to zero. Further, as shown in the fifth graph 1710, the primary side of the transmission medium 140 effectively sees a positive driving pulse when the buffered driver signal is greater than the delayed buffered driver signal, and a negative driving pulse when the buffered driver signal is less than the delayed buffered driver signal. The sixth graph 1712 shows the differential driver signal seen across the secondary side of the transmission medium 140. It will be appreciated that the differential driver signal on each side of the transmission medium 140 may be similar, aside from differences in their respective pulse information.

In this embodiment, at each point in time and on each of its sides, the transmission medium 140 may see either a positive driving pulse, a negative driving pulse, or no voltage difference, resulting in the three-level driver signals shown in the fifth and sixth graphs 1710 and 1712. Particularly, the three-level driver signals essentially include a positive driving pulse at each pulse beginning of the input pulse signal, a negative driving pulse at each pulse end of the input pulse signal, and a zero level everywhere else. In this way, it will now be apparent that the three-level driver signal may essentially include a three-level representation of the pulse information from the two-level input pulse signal (though possibly with additional artifacts, like delay). Further, it will be appreciated that the pulse width of the three-level driver signal is at least partially related to the amount of delay introduced by the delay units 1634. As such, adjusting the amount of delay may allow the effective adjustment of pulse width.

Each three-level driver signal may be passed across the transmission medium 140 to the opposite side of the communication system 1600. Because of the shared transmission medium 140, the signals received at each side of the communication system may include pulse information from both input voltage sources 110-1 and 110-2. The received signals are shown in the seventh, eighth, ninth, and tenth graphs 1714, 1716, 1718, and 1720.

Each received signal is then passed to the pulse canceling network 1390, including a number of resistors. The configuration and relative values of the resistors may be designed so that, when the signals are applied differentially to the inputs of each hysteresis comparator 1650, undesirable pulse information is canceled from the received signals. The differential input signals to the hysteresis comparators 1650 are shown in the eleventh and twelfth graphs 1722 and 1724. As discussed above, the hysteresis comparators 1650 may then convert their differential input signals to latched output signals, as shown in the thirteenth and fourteenth graphs 1726 and 1728.

The output of the hysteresis comparators 1650 may be passed as the output voltages 160 on each side of the communication system 1600. It will be appreciated that, depending on the components, signals, and other characteristics of the communication system 1600 and the application in which it is being used, the output voltages 160 (e.g., as shown in the thirteenth and fourteenth graphs 1726 and 1728) may differ from the input pulse signals (e.g., as shown in the first and second graphs 1702 and 1704). For example, there may be delay, noise, change in amplitude, etc. Still, it will now be appreciated that providing the communication system 1600 with the differentially driven pulse shaping unit 130 (e.g., the first buffer unit 1632, the second buffer unit 1636, and the delay unit 1634), may allow the output voltage 160 to substantially preserve the pulse information from the input voltage sources 110.

It will be appreciated that other embodiments of bidirectional communication systems are possible according to the invention. Further, different embodiments may exhibit certain characteristics which may be desirable or undesirable in certain applications. For example, comparing the embodiment of the communication system 1400 (using the TTTL driver unit 1430) of FIG. 14 to the embodiment of the communication system 1600 (using the differentially driven pulse transformer 1640) of FIG. 16 illustrates certain different characteristics between the two embodiments. One difference is that components of the communication system 1400 of FIG. 14 may operate using two source voltages (e.g., +Vs and −Vs), while the communication system 1600 of FIG. 16 may operate using only a single source voltage (e.g., +Vs). This may reduce the external component count when integrated into a monolithic IC. Another difference is that certain embodiments of the communication system 1600 of FIG. 16 may use a Faraday-shielded pulse transformer (or a center-tap pulse transformer with the center tap tied to ground), while the communication system 1400 of FIG. 14 may be designed to operate without Faraday shielding (or center-tapping). Yet another difference is that the pulse transformer used by the communication system 1400 of FIG. 14 may be replaced by a coaxial cable of similar characteristic impedance (e.g., 50 Ohms), while the pulse transformer used with the communication system 1600 of FIG. 16 may be replaced by a twisted wire pair of similar characteristic impedance.

It will be appreciated that, by using embodiments of the invention including those described above, communication systems may be provided with full duplex functionality. Further, it will be appreciated that components of the embodiments are operable to cancel undesirable signal information, while preserving desirable signal information. Even further, by using passive components in pulse canceling networks, embodiments of the invention operate without a need for complex handshaking and other routines. These and other features of the invention may allow embodiments of the invention to be used in upgrading legacy architecture. For example, a legacy 64-channel bus architecture with no handshaking capability may be provided for effectuating bidirectional parallel communication of a 32-bit signal (e.g., by using half the channels for each direction). By incorporating embodiments of the invention into the legacy architecture, it may be possible to use the same bus architecture to effectuate bidirectional parallel communication of 64-bit signals, effectively doubling the bandwidth of the system.

Figure 18:
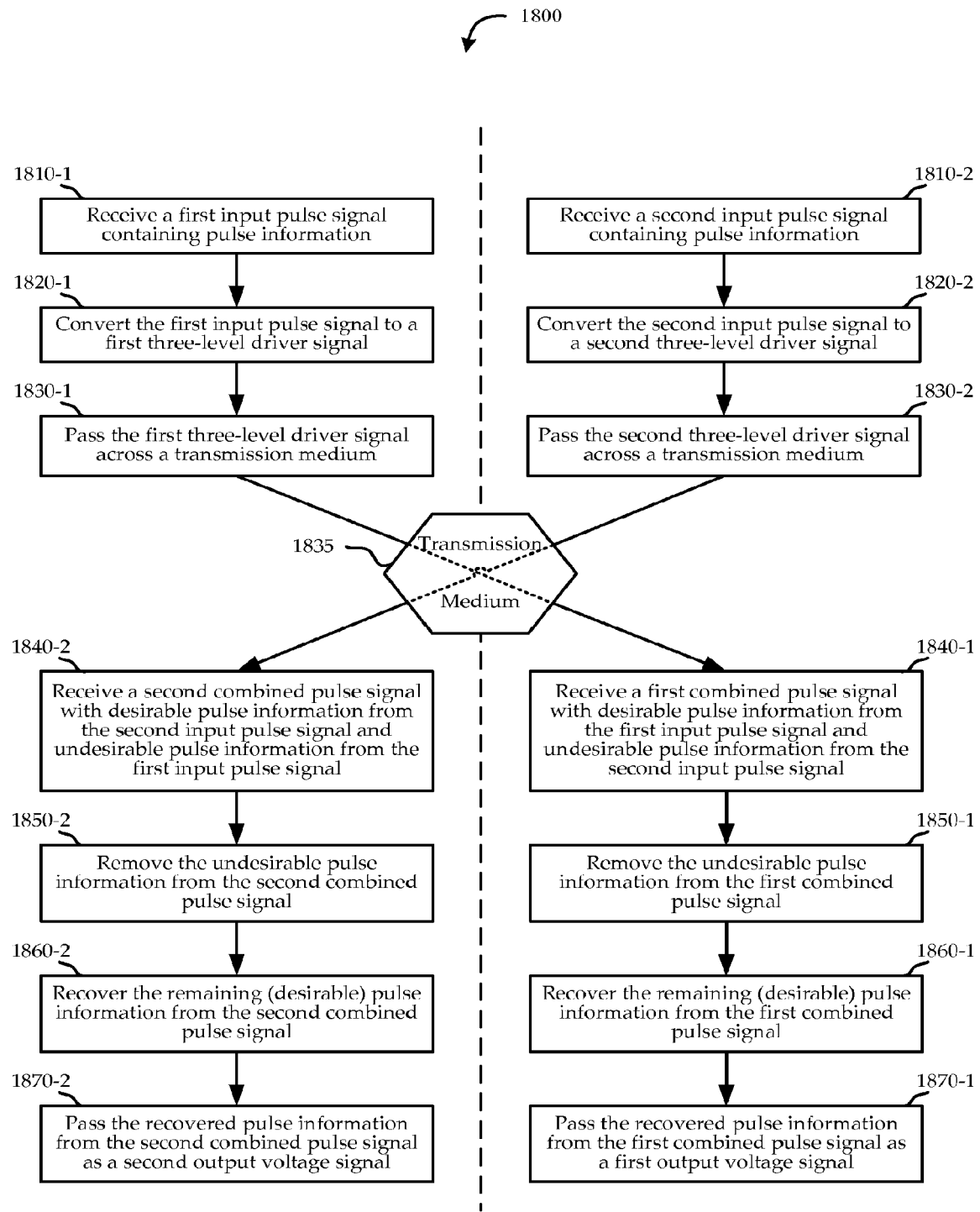
FIG. 18 shows a flow diagram of exemplary methods for providing bidirectional pulse signal information using a communication system, according to various embodiments of the invention.

FIG. 18 shows a flow diagram of exemplary methods for providing bidirectional pulse signal information using a communication system, according to various embodiments of the invention. The method 1800 is shown with two sides, each representing a side of an exemplary communication. For example, one side of the communication may include a first communicant sending Signal A and a second load receiving Signal B, and the other side of the communication may include a second communicant sending Signal B and a first load receiving Signal A.

The method 1800 begins at blocks 1810 by receiving input pulse signals that each contain pulse information For example, a first input pulse signal received at block 1810-1 may include pulse information for Signal A, and a second input pulse signal received at block 1810-2 may include pulse information for Signal B. The pulse information from the input pulse signals received at blocks 1810 may be converted to three-level driver signals at blocks 1820. At blocks 1830, the three-level driver signals may be passed across a transmission medium 1835.

On each side of the transmission medium 1835, combined pulse signals are received at blocks 1840, each of the combined pulse signals including pulse information from both input pulse signals received at blocks 1810. The pulse information coming from the opposite side of the transmission medium 1835 may be desirable, while the pulse information coming from the same side of the transmission medium 1835 may be undesirable. As such, at blocks 1850, the desirable pulse information is removed from each of the combined pulse signals received at blocks 1840. Once the undesirable pulse information is removed at blocks 1850, the remaining (i.e., desirable) pulse information may be recovered at blocks 1860. The recovered pulse information may then be output at blocks 1870 to be used across its intended load.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. It should also be appreciated that the following systems, methods, and software may individually or collectively be components of a larger system, wherein other procedures may take precedence over or otherwise modify their application. Also, a number of steps may be required before, after, or concurrently with the following embodiments.

Further, it should be emphasized that technology evolves and, thus, many of the elements are examples and should not be interpreted to limit the scope of the invention. Specific details are given in the description to provide a thorough understanding of the embodiments. However, it will be understood by one of ordinary skill in the art that the embodiments may be practiced without these specific details. In various embodiments, well-known circuits, processes, algorithms, structures, and techniques have been shown without unnecessary detail in order to avoid obscuring the embodiments. Additionally, it will be understood by one of ordinary skill in the art that the embodiments may be practiced with known substitutions without departing from the scope of the invention. For example, P-type and N-type devices may be interchanged with appropriate adjustments to contextual circuit topologies.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. Accordingly, the above description should not be taken as limiting the scope of the invention, as described in the following claims.

What is claimed is:

1. A system for communicating pulse information, the system comprising:
   a first pulse communication module coupled with a first terminal of a transmission medium, the first pulse communication module configured to:
      receive an input pulse signal from an input source, the input pulse signal having an input pulse width larger than a predetermined minimum pulse width;
      generate a delayed input pulse signal based on the input pulse signal;
      generate a first three-level signal based on the input pulse signal and the delayed input pulse signal, the first three-level signal comprising a first pulse corresponding to a beginning of the input pulse signal and transitioning between a first level and a second level and a second pulse corresponding to an end of the input pulse signal and transitioning between the first level and a third level, wherein a magnetic flux density change in the transmission medium during respective pulse widths of the first pulse and the second pulse is less than or equal to a magnetic flux density reset during a time period corresponding to the predetermined minimum pulse width; and
      drive the first terminal of the transmission medium with the first three-level signal.

2. The system of claim 1, further comprising:
   a second pulse communication module coupled to a second terminal of the transmission medium, the second pulse communication module configured to:
      receive, at the second terminal of the transmission medium, the first three-level signal; and
      generate a first output pulse as a function of the first three-level signal, the first output pulse having a first output pulse width that is substantially equal to the first input pulse width.

3. The system of claim 1, wherein the first pulse communication module is further configured to:
   receive, at the first terminal of the transmission medium, a combined pulse signal, the combined pulse signal comprising the first three-level signal and a second three-level signal, the second three level signal passed across the transmission medium from a second terminal of the transmission medium and corresponding to a second input pulse signal having a second input pulse width;
   cancel the first three-level signal from the combined pulse signal to generate a recovered pulse signal; and
   generate a second output pulse signal as a function of the recovered pulse signal, the second output pulse signal having an output pulse width that is substantially equal to the second input pulse width.

4. The system of claim 1, wherein the respective pulse widths of the first pulse and the second pulse are shorter than the predetermined minimum pulse width.

5. The system of claim 1, wherein the delayed input pulse signal is delayed from the input pulse signal by a duration that is independent of the input pulse width.

6. The system of claim 1, wherein the transmission medium is selected from a group consisting of:
   a pulse transformer;
   a small-signal pulse transformer; and
   a power pulse transformer.

7. The system of claim 1, wherein:
   the transmission medium has a primary end coupled with a first reference level and a secondary end coupled with a second reference level; and
   the transmission medium is operable to provide an isolation boundary between the first reference level and the second reference level.

8. The system of claim 7, wherein the first reference level is a chassis ground and the second reference level is a floating ground.

9. A method for communicating pulse information across a transmission medium, the method comprising:
   receiving an input pulse signal from an input source, the input pulse signal having an input pulse width larger than a predetermined minimum pulse width;
   generating a delayed input pulse signal based on the input pulse signal;
   generating a first three-level signal based on the input pulse signal and the delayed input pulse signal, the first three-level signal comprising a first pulse corresponding to a beginning of the input pulse signal and transitioning between a first level and a second level and a second pulse corresponding to an end of the input pulse signal and transitioning between the first level and a third level, wherein a magnetic flux density change in the transmission medium during respective pulse widths of the first pulse and the second pulse is less than or equal to a magnetic flux density reset during a time period corresponding to the predetermined minimum pulse width; and
   driving a first terminal of the transmission medium with the first three-level signal.

10. The method of claim 9, further comprising:
    receiving, at a second terminal of the transmission medium, the first three-level signal; and
    generating a first output pulse as a function of the first three-level signal, the first output pulse having a first output pulse width that is substantially equal to the first input pulse width.

11. The method of claim 9, further comprising:
    receiving, at the first terminal of the transmission medium, a combined pulse signal, the combined pulse signal comprising the first three-level signal and a second three-level signal, the second three level signal passed across the transmission medium from a second terminal of the transmission medium and corresponding to a second input pulse signal having a second input pulse width;
    canceling the first three-level signal from the combined pulse signal to generate a recovered pulse signal; and
    generating a second output pulse signal as a function of the recovered pulse signal, the second output pulse signal having an output pulse width that is substantially equal to the second input pulse width.

12. The method of claim 9, wherein the respective pulse widths of the first pulse and the second pulse are shorter than the predetermined minimum pulse width.

13. The method of claim 9, wherein the delayed input pulse signal is delayed from the input pulse signal by a duration that is independent of the input pulse width.

14. The method of claim 9, wherein the transmission medium is selected from a group consisting of:
    a pulse transformer;
    a small-signal pulse transformer; and
    a power pulse transformer.

15. The method of claim 9, wherein:
    the transmission medium has a primary end coupled with a first reference level and a secondary end coupled with a second reference level; and the transmission medium is operable to provide an isolation boundary between the first reference level and the second reference level.

16. The method of claim 15, wherein the first reference level is a chassis ground and the second reference level is a floating ground.

* * * * *